United States Patent [19]

Inoue et al.

[11] Patent Number: 5,801,080
[45] Date of Patent: Sep. 1, 1998

[54] METHOD OF MANUFACTURING SEMICONDUCTOR SUBSTRATE HAVING TOTAL AND PARTIAL DIELECTRIC ISOLATION

[75] Inventors: Yasuo Inoue; Tadashi Nishimura; Yasuo Yamaguchi; Toshiaki Iwamatsu, all of Hyogo, Japan

[73] Assignee: Mitsubishi Denki Kabushiki Kaisha, Tokyo, Japan

[21] Appl. No.: 837,959

[22] Filed: Apr. 14, 1997

Related U.S. Application Data

[62] Division of Ser. No. 675,510, Jul. 3, 1996, Pat. No. 5,652,454, which is a continuation of Ser. No. 264,116, Jun. 22, 1994, abandoned.

[30] Foreign Application Priority Data

Jul. 5, 1993 [JP] Japan ................................ 5-165426
Dec. 3, 1993 [JP] Japan ................................ 5-304405

[51] Int. Cl.⁶ ........................................ H01L 21/76
[52] U.S. Cl. ................................ 438/405; 438/295
[58] Field of Search ........................ 438/405, 295, 438/222, 444

[56] References Cited

U.S. PATENT DOCUMENTS

| | | |
|---|---|---|
| 4,478,655 | 10/1984 | Nagakubo et al. . |
| 4,696,092 | 9/1987 | Doering et al. . |
| 4,889,829 | 12/1989 | Kawai . |
| 5,028,559 | 7/1991 | Zdebel et al. . |
| 5,120,675 | 6/1992 | Pollack . |
| 5,164,326 | 11/1992 | Foerstner et al. . |
| 5,440,161 | 8/1995 | Iwamatsu et al. . |
| 5,462,062 | 10/1995 | Hwang . |

FOREIGN PATENT DOCUMENTS

| | | |
|---|---|---|
| 53-68990 | 6/1978 | Japan . |
| 62-104136 | 5/1987 | Japan . |
| 5-182909 | 7/1993 | Japan . |

OTHER PUBLICATIONS

A High Speed and Low Power Consumption 16 K Gate Gate Array on Ultra Thin SOI Film, Institute of Electronics, Information and Communication Engineers of Japan, Y. Yamaguchi et al., pp. 81–86, 1992.

*Primary Examiner*—George R. Fourson
*Attorney, Agent, or Firm*—Lowe, Price, LeBlanc & Becker

[57] ABSTRACT

According to a semiconductor device of the present invention, a field oxide film is formed so as to cover the main surface of an SOI layer and to reach the main surface of a buried oxide film. As a result, a pMOS active region of the SOI and an nMOS active region of the SOI can be electrically isolated completely. Therefore, latchup can be prevented completely. As a result, it is possible to provide a semiconductor device using an SOI substrate which can implement high integration by eliminating reduction of the breakdown voltage between source and drain, which was a problem of a conventional SOI field effect transistor, as well as by efficiently disposing a body contact region, which hampers high integration, and a method of manufacturing the same.

4 Claims, 48 Drawing Sheets

FIG. 85 PRIOR ART
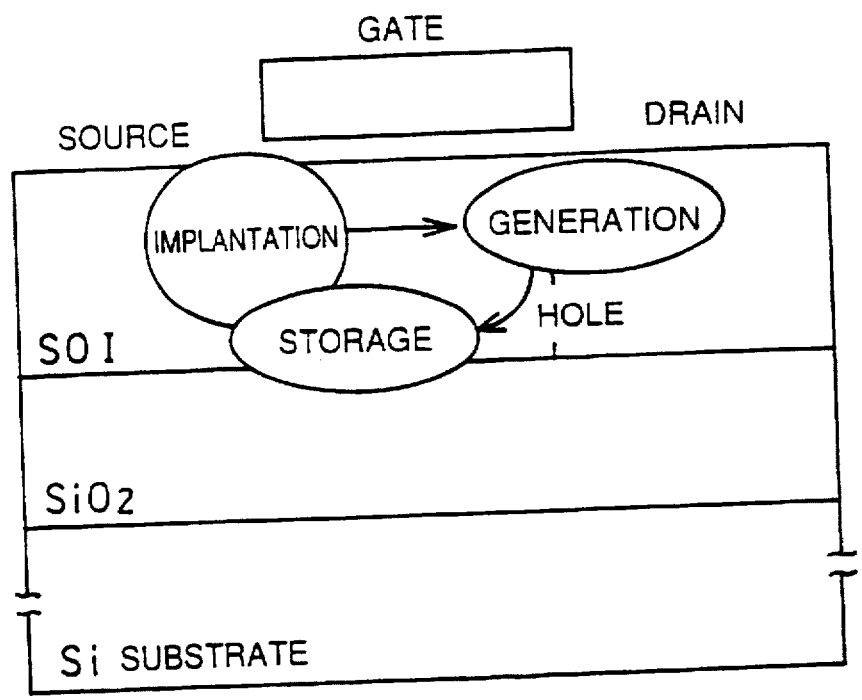
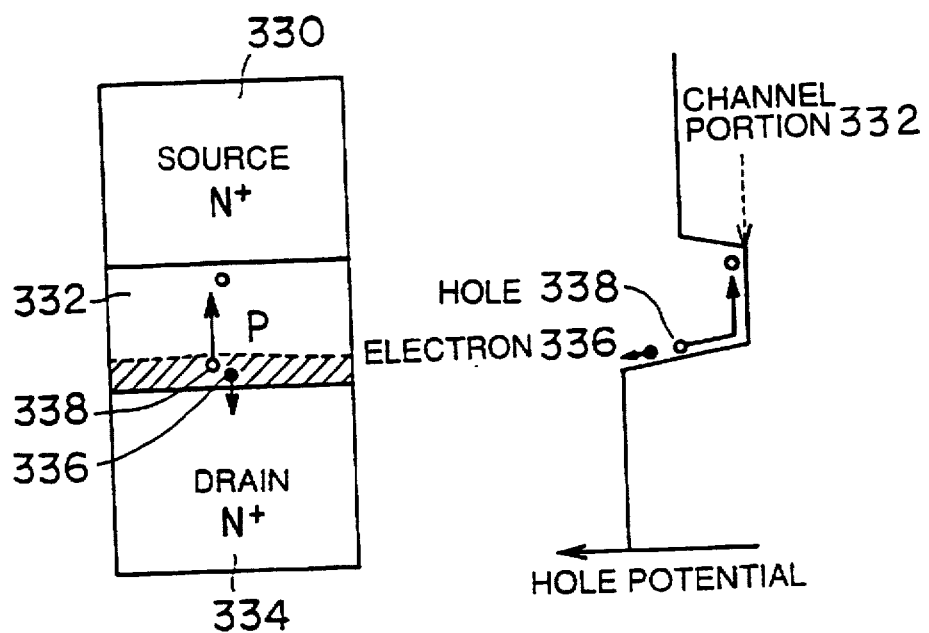
FIG. 86A PRIOR ART
FIG. 86B PRIOR ART

METHOD OF MANUFACTURING SEMICONDUCTOR SUBSTRATE HAVING TOTAL AND PARTIAL DIELECTRIC ISOLATION

This application is a division of application Ser. No. 08/675,510, filed Jul. 3, 1996, now U.S. Pat. No. 5,652,454 which is a Continuation application of Ser. No. 08/264,116, filed Jun. 22, 1994, now abandoned.

BACKGROUND OF THE INVENTION

1. Field of the Invention

The present invention generally relates to semiconductor devices and a method of manufacturing the same, and more particularly, a semiconductor device formed on an SOI (Silicon on Insulator) substrate in order to implement high speed operation and a method of manufacturing the same.

2. Description of the Background Art

Referring to FIGS. 75 to 77, description will be given of a plan structure and a sectional structure of a semiconductor device having a gate array, having a plurality of gates disposed thereon, formed on a silicon substrate.

At a prescribed position of a silicon substrate 316, formed is a field oxide film 302. Silicon substrate 316 includes a p type MOS field effect transistor forming region 310, and an n type MOS field effect transistor forming region 312 formed therein. Gate electrode 304 are disposed regularly in respective MOS field effect transistor forming regions 310, 312. In a semiconductor device including a gate array structure as described above, respective blocks in which gate electrodes 304 are disposed are electrically isolated from each other by field oxide film 302. In one block, active regions are electrically isolated by gate electrode 304.

Referring to FIG. 78, the operational principle of isolation of transistors by an electrode will be specifically described, taking n type MOS field effect transistor forming region 312 as an example. By fixing gate electrode 304 to a ground potential, for example, a transistor 317 formed of a gate electrode 318, a source region 320 and a drain region 322, and a transistor 323 formed of a gate electrode 324, a source region 326 and a drain region 328 are electrically isolated from each other. These transistors can operate independently. In p type MOS field effect transistor forming region 310, by fixing to the power supply potential gate electrode 304 between transistors to be isolated, the similar effects can be obtained.

As described above, a method for electrically isolating transistors by fixing a gate electrode between the transistors to be isolated to the power supply potential or the ground potential is called a gate isolation method. The gate electrode between the transistors is called a gate isolation gate electrode. The gate isolation method is suitable for high integration as compared to an isolation method using a field oxide film, because the gate electrode can effectively be used in the former method.

Description will now be given of a semiconductor device configuring a 3-input NAND gate using the above-described gate isolation method with reference to FIGS. 79 and 80. FIG. 80 is a plan view of the semiconductor device configuring a 3-input NAND gate shown in (a), (b) of FIG. 79. In FIG. 80, the upper block corresponds to a p type MOS field effect transistor forming region, and the lower block corresponds to an n type MOS field effect transistor forming region. By configuring a gate electrode and a source/drain region in an internal interconnection structure as shown in FIG. 80, a 3-input NAND gate can be easily configured. In FIG. 80, by fixing the rightmost gate electrode of the p type MOS field effect transistor forming region and the rightmost gate electrode of the n type MOS field effect transistor forming region to the power supply potential and the ground potential, respectively, these forming regions can be electrically isolated from the other adjacent transistors.

A semiconductor device having a conventional gate array having a plurality of gates disposed therein, which is described above, is formed on a bulk silicon substrate. Formation of such a semiconductor device on an SOI (Silicon on Insulator) substrate is currently studied. If a CMOS (Complementary Metal-Oxide Semiconductor) field effect transistor is formed on an SOI substrate, the following features can be obtained as compared to a CMOS field effect transistor formed on a bulk silicon substrate:

(1) Increase in drivability
(2) Reduction of junction capacitance in source/drain region
(3) Latchup free FIGS. 81 and 82 show cross sections in the case where MOS field effect transistors are formed on a bulk silicon substrate and an SOI substrate, respectively. In the case of the transistor fabricated on the SOI substrate, a depletion layer under a channel extends only to a buried oxide film. Therefore, a voltage applied to a gate electrode effectively generates carriers in the channel, resulting in increase of drivability. Since a source/drain junction is formed only in a surface perpendicular to an SOI layer because of the buried oxide film, the junction capacitance in the source/drain region can be reduced. Since respective MOS field effect transistors are electrically isolated completely by the buried oxide film, latchup, which has been conventionally problematic, will not occur.

Because of the above features, high speed operation without latchup can be expected by forming a gate array on an SOI substrate.

In an MOS field effect transistor fabricated on the conventional SOI substrate, the breakdown voltage between source and drain is lowered as compared to an MOS field effect transistor fabricated on the bulk silicon substrate, because of the substrate floating effect of an SOI layer serving as a channel. Referring to FIGS. 83 and 84, described is how the breakdown voltage between source and drain is lowered because of the substrate floating effect. FIG. 83 shows the Id-Vd characteristics of an MOS field effect transistor fabricated on a bulk silicon substrate, and FIG. 84 shows the Id-Vd characteristics of an MOS field effect transistor fabricated on an SOI substrate.

Referring to these figures, in the MOS field effect transistor fabricated on the bulk silicon substrate, the breakdown voltage is 5V or more. On the other hand, in the MOS field effect transistor fabricated on the SOI substrate, the breakdown voltage is only approximately 2V.

Description will now be given of the substrate floating effect with reference to FIGS. 85 and 86. A hole 338 generated by impact ionization in a depletion layer in the vicinity of a drain region 334 is stored in a lower portion of a channel region 332 in the vicinity of a source region 330. Holes 338 are sequentially accumulated in the lower portion of channel region 332, thereby increasing the potential of an SOI layer to induce injection of an electron 336 from source region 330. The injected electron 336 reaches the vicinity of drain region 334 to generate new hole 338. As described above, a so-called feed forward loop formed by injection of electron 336 and generation of hole 338 causes the breakdown voltage between source and drain to decrease.

In order to prevent the substrate floating effect, several methods are being studied. The most reliable one is a method of preventing storage of holes 338 by fixing the potential of a channel region 344, with reference to FIG. 87. In the case of an n type MOS field effect transistor, for example, storage of holes 338 can be prevented by fixing the potential of the channel region to ground potential. Similarly, in the case of a p type MOS field effect transistor, storage of holes 338 can be prevented by fixing the potential of the channel region to power supply potential. In order to fix the potential of channel region 332, the SOI layer under gate electrode 304 is drawn out, and a region 350 for providing a body contact 352 is formed. As a result, storage of holes 338 can be prevented. However, this method necessitates an additional region 350 for forming a body contact, which hampers high integration of a semiconductor device.

SUMMARY OF THE INVENTION

One object of the present invention is to provide a semiconductor device preventing reduction of a breakdown voltage between source and drain, which has been a problem to an MOS field effect transistor formed on a conventional SOI substrate, and a method of manufacturing the same.

Another object of the present invention is to provide a semiconductor device using an SOI substrate which can be highly integrated by disposing efficiently a region of a body contact, and a method of manufacturing the same.

In order to achieve the above-described objects, the semiconductor device according to the present invention includes, in one aspect, a semiconductor layer, a first transistor forming region, a second transistor forming region, and a third field oxide film. The semiconductor layer is formed on the main surface of an insulating layer. The first transistor forming region includes a plurality of MOS field effect transistors of a first conductivity type formed on the main surface of the semiconductor layer, and first field oxide films respectively isolating the plurality of MOS field effect transistors of the first conductivity type.

The second transistor formation region includes a plurality of MOS field effect transistors of a second conductivity type, and second field oxide films respectively isolating the plurality of MOS field effect transistors of the second conductivity type. The third field oxide film is formed to cover the main surface of the semiconductor layer and to reach the main surface of the insulating layer. The third field oxide film is provided for isolating the first transistor forming region and the second transistor forming region.

In order to achieve the above objects, the semiconductor device according to the present invention includes, in another aspect, a semiconductor layer, a first transistor forming region, a second transistor forming region, and a field oxide film. The semiconductor layer is formed on the main surface of an insulating layer. The first transistor forming region is formed on the main surface of the semiconductor layer and includes a plurality of MOS field effect transistors of a first conductivity type, and first field shield gate electrodes respectively isolating the plurality of MOS field effect transistors of the first conductivity type.

The second transistor forming region is formed on the main surface of the semiconductor layer and includes a plurality of MOS field effect transistors of a second conductivity type, and second field shield gate electrodes respectively isolating the plurality of MOS field effect transistors of the second conductivity type. The field oxide film is formed to cover the main surface of the semiconductor layer and to reach the main surface of the insulating layer. The field oxide film is provided for isolating the first transistor forming region and the second transistor forming region.

According to the semiconductor device, the field oxide film is formed to cover the main surface of the semiconductor layer and to reach the main surface of the insulating layer. As a result, the first transistor forming region and the second transistor forming region can be electrically isolated from each other completely. Therefore, latchup between the first transistor forming region and the second transistor forming region can be prevented completely.

In order to achieve the above objects, the semiconductor device according to the present invention includes, in a still another aspect, a semiconductor layer, a first transistor forming region, a second transistor forming region, and a mesa isolation region. The semiconductor layer is formed on the main surface of an insulating layer. The first transistor forming region is formed on the main surface of the semiconductor layer and includes a plurality of MOS field effect transistors of a first conductivity type, and first field shield gate electrodes respectively isolating the plurality of MOS field effect transistors of the first conductivity type.

The second transistor forming region is formed on the main surface of the semiconductor layer and includes a plurality of MOS field effect transistors of a second conductivity type, and second field shield gate electrodes respectively isolating the plurality of MOS field effect transistors of the second conductivity type. The mesa isolation region is provided for isolating the first transistor forming region and the second transistor forming region.

According to the semiconductor device, the mesa isolation region is provided for isolating the first transistor forming region and the second transistor forming region. As a result, the first transistor forming region and the second transistor forming region can be electrically isolated from each other completely. Therefore, latchup between the regions can be prevented completely.

In order to achieve the above objects, the method of manufacturing a semiconductor device according to the present invention includes, in one aspect, the following steps.

First, an insulating layer is formed on a substrate. A semiconductor layer is then formed on the insulating layer. An oxide film is formed on the semiconductor layer. A plurality of first field oxide films reaching the insulating film are formed in a prescribed position with an LOCOS (Local Oxidation Of Silicon) method. Again with the LOCOS method, second field oxide films smaller in thickness than the first field oxide films are formed in a region sandwiched by the first field oxide films.

In order to achieve the above objects, the method of manufacturing a semiconductor device according to the present invention includes, in another aspect, the following steps.

First, an insulating film is formed on a substrate. A semiconductor layer is then formed on the insulating film. An oxide film is formed on the semiconductor layer. First field oxide films having a first width and second field oxide films having a second width smaller than the first width are formed with an LOCOS method. Again with the LOCOS method, only the first field oxide films are further oxidized in order to increase in thickness until they reach the insulating film.

In order to achieve the above objects, the method of manufacturing a semiconductor device according to the present invention includes, in a still another aspect, the following steps.

First, an insulating film is formed on a substrate. A semiconductor layer is then formed on the insulating film. An oxide film is formed on the semiconductor layer. A nitride film is formed on the oxide film. A resist film having a prescribed pattern is formed on the nitride film. With the resist film used as a mask, the semiconductor layer is etched to a prescribed depth, forming recessed portions of a prescribed depth in the semiconductor layer.

After removing the resist film, a resist film having a prescribed pattern is again formed. With this resist film used as a mask, the nitride film positioned between the recessed portions is patterned. After removing the resist film, with the nitride film used as a mask, first field oxide films obtained by growth of the oxide film in the recessed portion reaching the insulating film, and second field oxide films between the recessed portions are formed with an LOCOS method.

In order to achieve the above objects, the method of manufacturing a semiconductor device according to the present invention includes, in a further aspect, the following steps.

First, an insulating film is formed on a substrate. A semiconductor layer is then formed on the insulating film. An oxide film is formed on the semiconductor layer. A buffer layer is formed on the oxide film. A nitride film is formed on the buffer layer. On the nitride film, formed is a first resist film having a first opening portion and a second opening portion larger in width than the first opening portion. With the resist film used as a mask, the nitride film is etched until the surface of the buffer layer is exposed.

A second resist film is formed so as to fill only the first opening portion. With the first resist film and the second resist film used as a mask, the buffer layer is etched. After removing the first and second resist films, with the nitride film used as a mask, first field oxide films reaching the insulating film and second field oxide films are formed at positions of the first opening portion and the second opening portion, respectively, with an LOCOS method.

According to the method of manufacturing a semiconductor device, it is possible to easily form a third field oxide film provided to cover the main surface of the semiconductor layer and to reach the main surface of the insulating layer for electrically isolating the first transistor forming region and the second transistor forming region completely, first field oxide films in the first transistor forming region, and second field oxide films in the second transistor forming region.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 85 is a first diagram for explaining the substrate floating effect.

FIGS. 86A and 86B are second diagrams for explaining the substrate floating effect.

DESCRIPTION OF THE PREFERRED EMBODIMENTS

Description will now be given of the first embodiment of the present invention with reference to the drawings.

Figure 1:
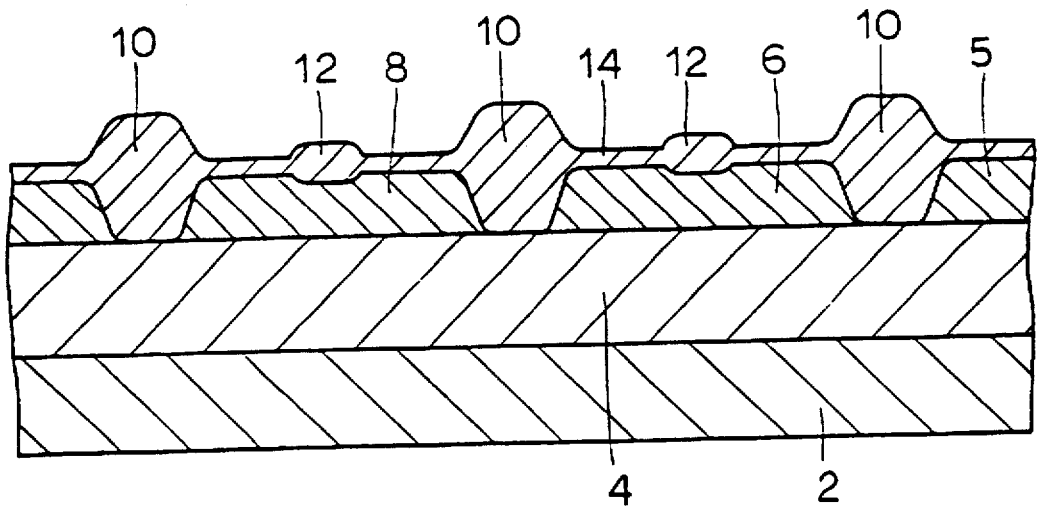
FIG. 1 is a first sectional view of a semiconductor device according to a first embodiment of the present invention.

Referring to FIG. 1, a sectional structure of the semiconductor device of the first embodiment will be described. A buried oxide film 4 of a thickness of approximately 3800 Å to 4200 Å is formed on a silicon substrate 2. An SOI layer 5 of a thickness of approximately 500 Å to 1000 Å is formed on buried oxide film 4. A first field oxide film 10 covering the surface of SOI layer 5 and reaching the surface of buried oxide film 4 is formed on the surface of SOI layer 5. First field oxide film 10 isolates a pMOS field effect transistor active region 6 and an nMOS field effect transistor active region 8. A second field oxide film 12 separating a pMOS field effect transistor into two or more regions is formed on the surface of pMOS field effect transistor active region 6. Second field oxide film 12 separating an nMOS field effect transistor into two or more regions is also formed on the surface of nMOS field effect transistor active region 8.

As shown in FIG. 1, by forming first field oxide film 10 large in thickness so as to be in contact with buried oxide film 4, a pMOS field effect transistor forming region and an nMOS field effect transistor forming region can be isolated from each other completely. Latchup can be completely prevented. By forming second field oxide film 12 smaller in thickness than first field oxide film 10, it is possible to fix the potential of a channel portion using SOI layer 5 of a region under second field oxide film 12.

Figure 2:
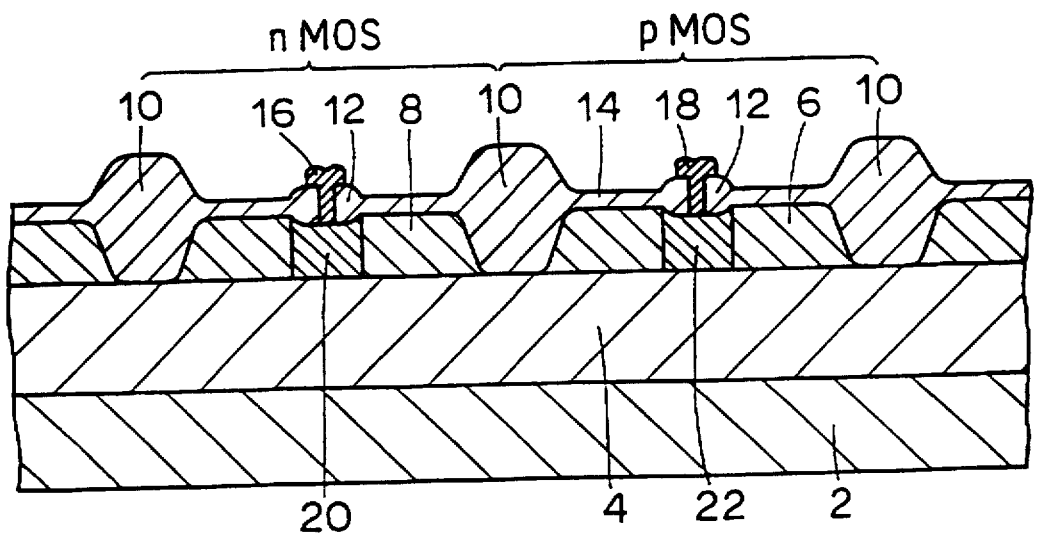
FIG. 2 is a second sectional view of the semiconductor device according to the first embodiment of the present invention.

Referring to FIG. 2, description will now be given of a method of fixing the potential under second field oxide film 12.

In pMOS field effect transistor active region 6, an n type potential fixing region 22 is formed in a region under second field oxide film 12. A potential fixing electrode 18 penetrating through second field oxide film 12 is provided so as to electrically connect to n type potential fixing region 22. Also in nMOS field effect transistor active region 8, a p type potential fixing region 20 is provided in a region under second field oxide film 12. A potential fixing electrode 16 penetrating through second field oxide film 12 is provided so as to electrically connect to p type potential fixing region 20.

Figure 3:
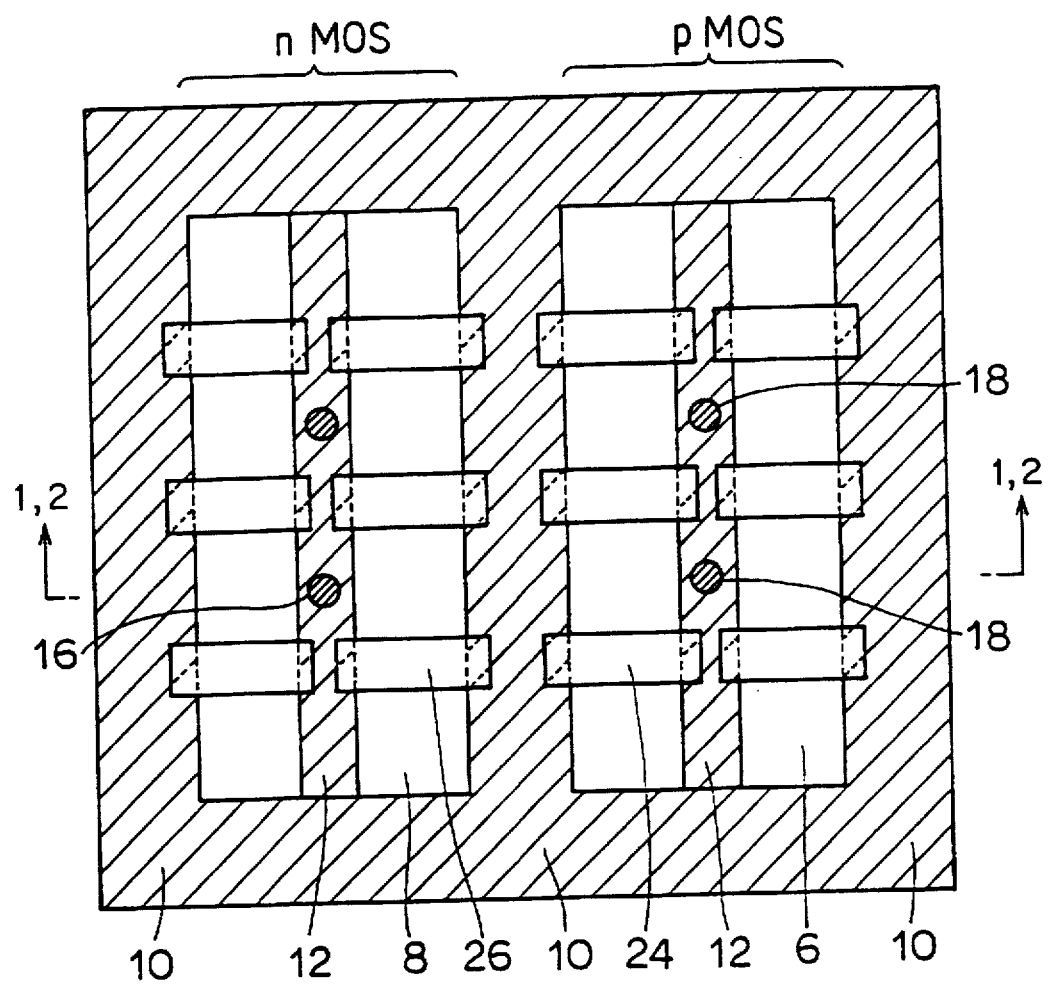
FIG. 3 is a first plan view of the semiconductor device according to the first embodiment of the present invention.

Referring to FIG. 3, description will now be given of a plan structure of the semiconductor device shown in FIGS. 1 and 2. Field oxide film 10 is formed so as to surround pMOS field effect transistor active region 6 and nMOS field effect transistor active region 8. Second field oxide film 12 is formed in pMOS field effect transistor active region 6. A plurality of gate electrodes 24 of the pMOS field effect transistor are disposed over first field oxide film 10 and second field oxide film 12. Potential fixing electrode 18 is provided between gate electrode 24 of the p MOS field effect transistor of second field oxide film 12.

Second field oxide film 12 is also provided in nMOS field effect transistor active region 8. A plurality of gate electrode 26 of the nMOS field effect transistor are provided over first field oxide film 10 and second field oxide film 12. Potential fixing electrode 16 is provided between gate electrodes 26 of the nMOS field effect transistor of second field oxide film 12.

Figure 4:
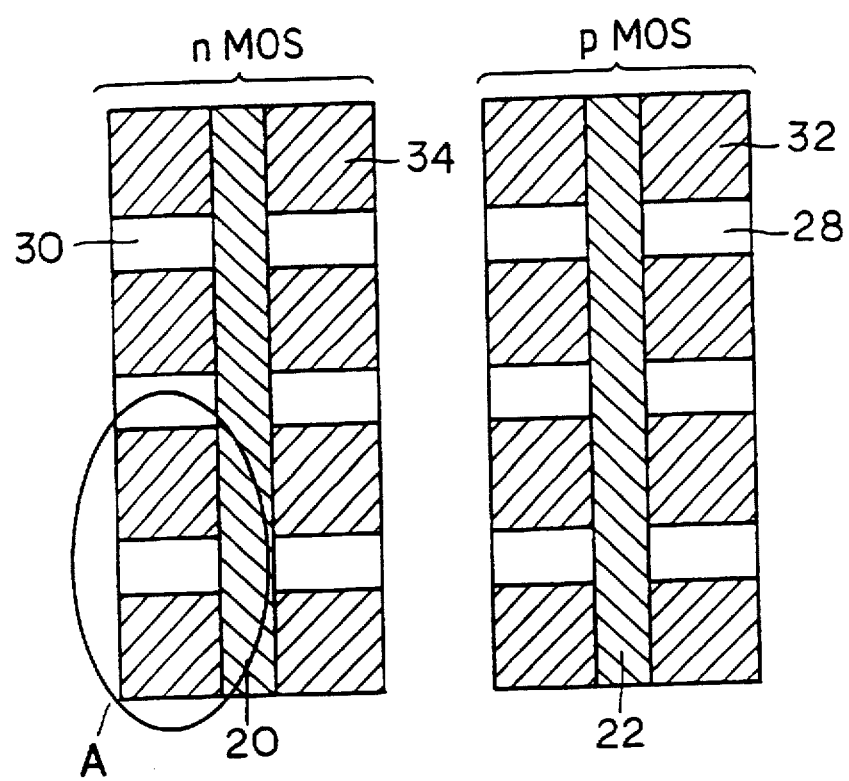
FIG. 4 is a second plan view of the semiconductor device according to the first embodiment of the present invention.

Referring to FIG. 4, description will now be given of a conductivity type of the semiconductor device shown in FIG. 3. In pMOS field effect transistor active region 6, formed is a source/drain region 32 of the pMOS field effect transistor of a p type region having an impurity concentration of $1\times10^{19}$ cm$^{-3}$ or more. Also formed is a channel region 28 of the pMOS field effect transistor of an n type region having an impurity concentration of $1\times10^{18}$ cm$^{-3}$ or less. n type potential fixing region 22 having an impurity concentration higher than that of channel region 28 is formed in a region positioned lower of second field oxide film 12.

In nMOS field effect transistor active region 8, formed is a source/drain region 34 of the nMOS field effect transistor of an n type region having an impurity concentration of $1\times10^{19}$ cm$^{-3}$ or more. Also formed is a channel region 30 of the nMOS field effect transistor of a p type region having an impurity concentration of $1\times10^{18}$ cm$^{-3}$ or less. p type potential fixing region 20 having an impurity concentration higher than that of channel region 30 is formed in a region positioned lower of second field oxide film 12.

Figures 5A, 5B:
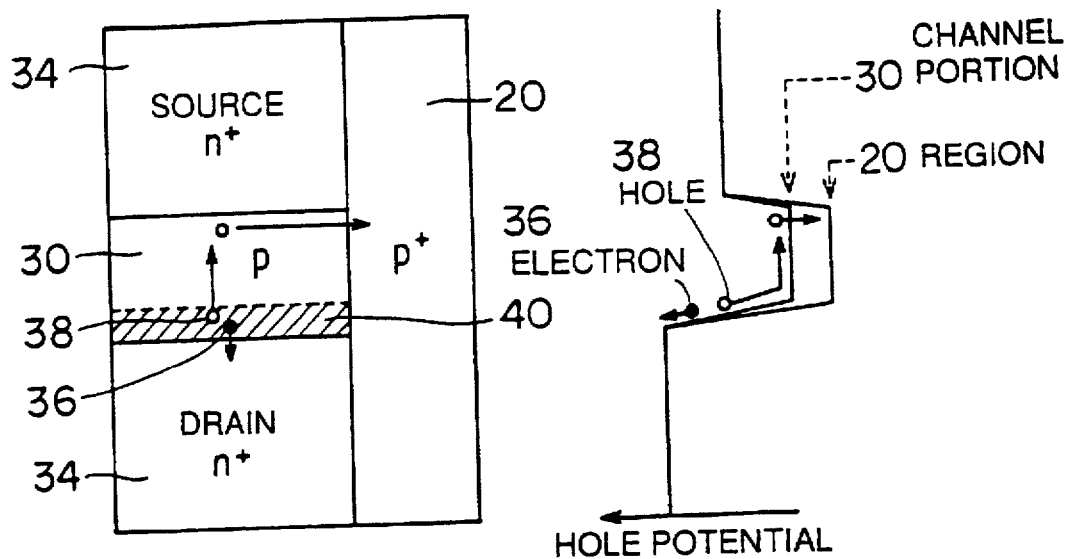
FIGS. 5A and 5B are schematic diagrams showing the operational principle of the semiconductor device according to the first embodiment of the present invention.

Referring to FIG. 5, description will be given of an improvement of a breakdown voltage between source and drain. FIG. 5(a) shows an enlarged A region of nMOS field effect transistor active region 8 shown in FIG. 4. In the figure, impurity concentrations of n type source region 34, n type drain region 34, p type channel region 30 and p type potential fixing region 20 are set at $1\times10^{20}$ cm$^{-3}$, $1\times10^{20}$ cm$^{-3}$, $1\times10^{17}$ cm$^{-3}$, and $1\times10^{18}$ cm$^{-3}$, respectively.

Consider the case where an MOS field effect transistor having its gate potential set at 0V is turned off, for example. With the source potential set at 0V, when 5V is applied to drain region 34, for example, a depletion layer 40 extends in a pn junction portion in the vicinity of drain region 34, and most of the voltage of 5V is applied to depletion layer 40. As a result, carriers accelerated by the electric field in depletion layer 40 causes impact ionization to generate a new pair of an electron 36 and a hole 38. The generated electron 36 is attracted by the electric field in depletion layer 40 to enter drain region 34.

On the other hand, the generated hole 38 enters channel region 30 according to the electric field in depletion layer 40. As the potential for hole 38 of channel region 30 changes in a shape of a valley as shown in FIG. 5(b), hole 38 is accumulated in channel region 30.

Since p type potential fixing region 20 is formed at the side of channel region 30 in this embodiment, however, the accumulated hole 38 flows to p type potential fixing region 20 at a lower potential level. Therefore, hole 38 flowing in p type potential fixing region 20 is drawn to the outside of the element by potential fixing electrode 16. As a result, the potential is not increased by storage of hole 38 in channel region 30. Therefore, the breakdown voltage between source and drain can be improved. Even in the pMOS field effect transistor active region, it is possible to improve the breakdown voltage between source and drain by drawing an electron accumulated in the channel through potential fixing electrode 18.

Description will now be given of the second embodiment of the present invention with reference to FIGS. 6 to 12. The second embodiment corresponds to a first method of manufacturing the semiconductor device shown in FIGS. 1 and 2.

Figure 6:
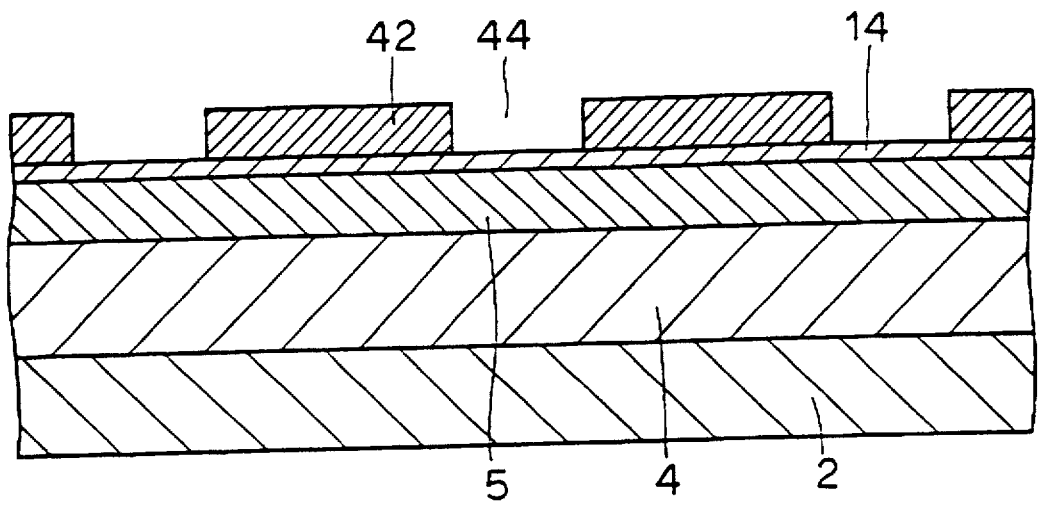
FIGS. 6 to 12 are sectional views showing the first to the seventh manufacturing steps of a semiconductor device according to a second embodiment of the present invention.

Referring to FIG. 6, buried oxide film 4 of a thickness of 3800 Å to 4200 Å is formed on silicon substrate 2 under the conditions of an oxygen ion concentration of $1\times10^{18}$ cm$^3$, energy of approximately 180 keV, and a thermal treatment temperature of 1300° C. to 1350° C. On buried oxide film 4, formed is SOI layer 5 of a thickness of 500 Å to 1000 Å under the conditions of an oxygen ion concentration of $1\times10^{18}$ cm$^3$, energy of approximately 180 keV, and a thermal treatment temperature of 1300° C. to 1350° C.

A silicon oxide film 14 of a thickness of 100 Å to 300 Å is formed on SOI layer 5 with a thermal oxidation method under the condition of a thermal treatment temperature of 950° C. A silicon-nitride film 42 of a thickness of approximately 500 Å to 2000 Å having a prescribed opening portion 44 is formed on silicon oxide film 14.

Figure 7:
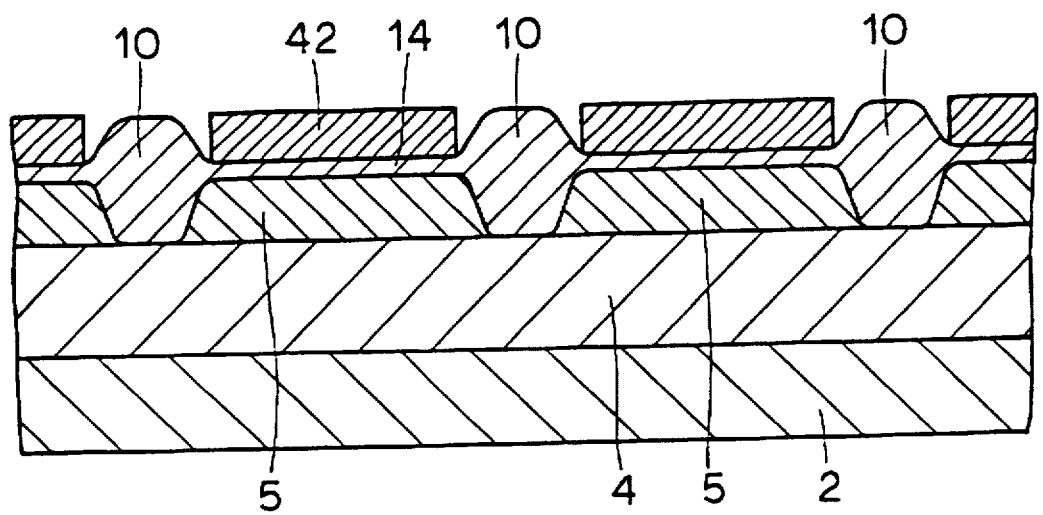
Figure 8:
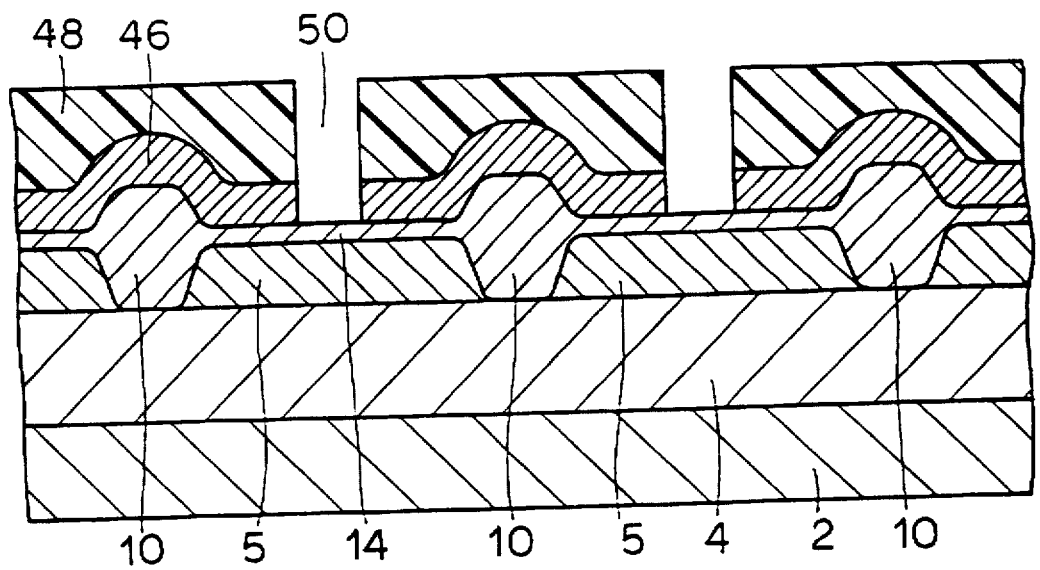

Referring to FIG. 7, first field oxide film 10 of a thickness of approximately 1000 Å to 2000 Å is formed with an LOCOS method under the condition of a thermal treatment temperature of 950° C. to 1100° C. First field oxide film 10 is so formed that the bottom surface thereof reaches the surface of buried oxide film 4. Referring to FIG. 8, after depositing a silicon nitride film 46 on the entire surface of silicon substrate 2, a resist film 48 is formed having a prescribed opening portion 50 in a region between first field oxide films 10. With resist film 48 used as a mask, silicon nitride film 46 is etched.

Figure 9:
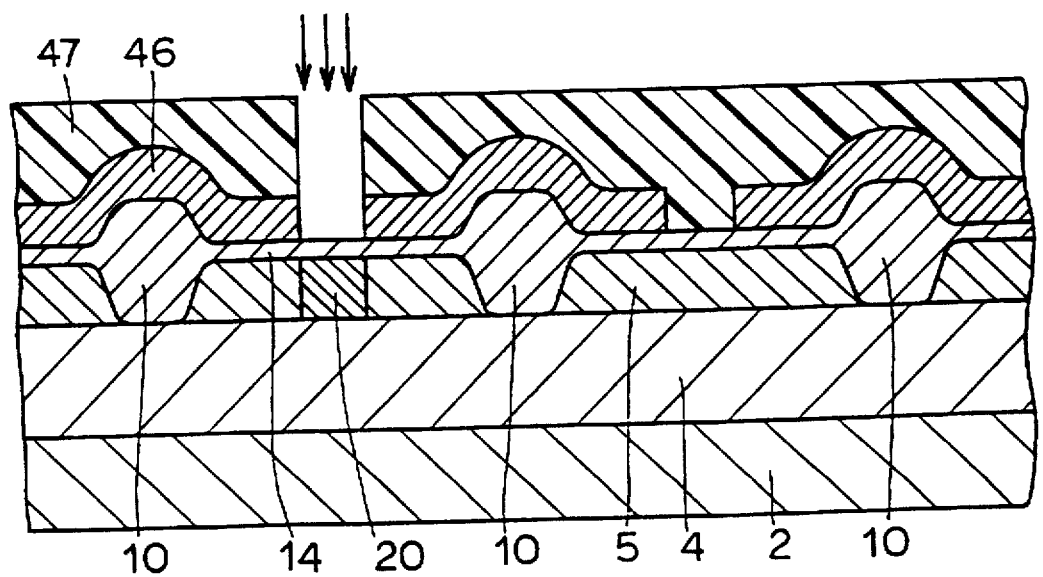
Figure 10:
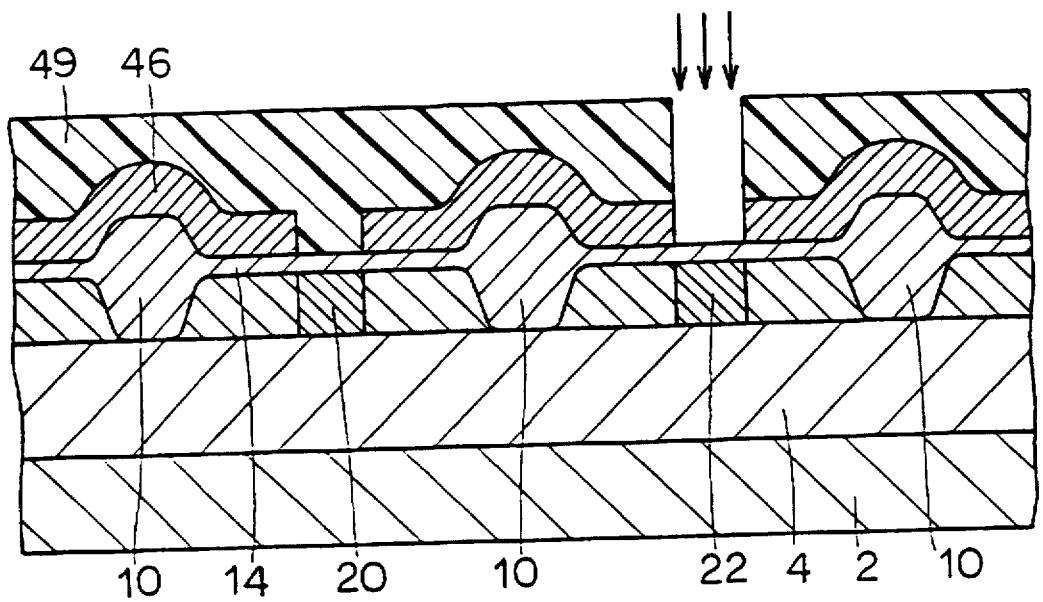

Referring to FIG. 9, after removing resist film 48, n type impurities such as boron are implanted into SOI layer 5 under the conditions of an implantation amount of $1\times10^{13}$ to $1\times10^{14}$ cm$^{-2}$ and implantation energy of approximately 20 keV with a new resist film 47 used as a mask, to form p type potential fixing region 20. Referring to FIG. 10, after removing resist film 47, n type impurity ions such as phosphorus are implanted into SOI layer 5 under the conditions of an implantation amount of $1\times10^{13}$ to $1\times10^{14}$ cm$^{-2}$ and implantation energy of 40 keV with a new resist film 49 used as a mask, to form n type potential fixing region 22.

Figure 11:
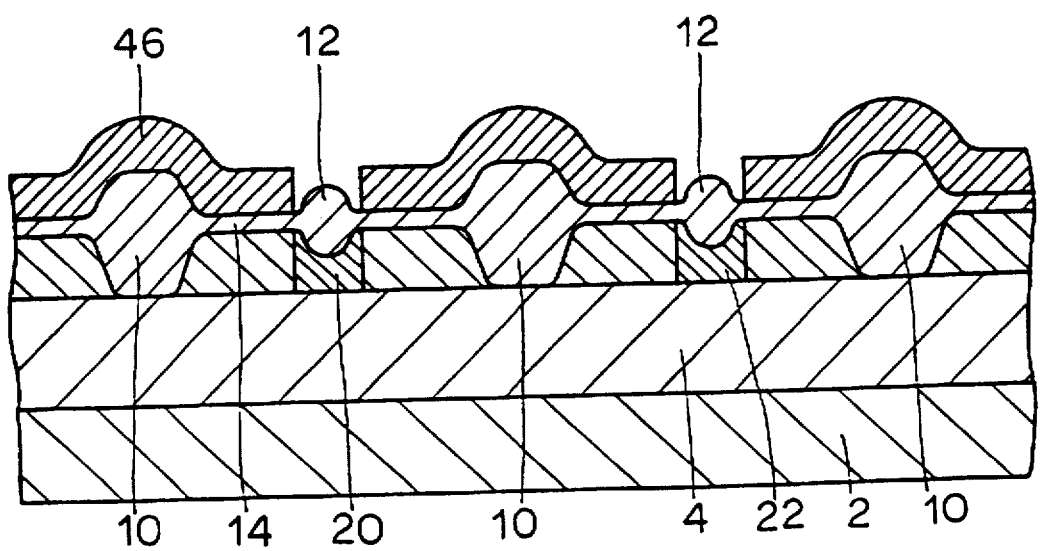

Referring to FIG. 11, after removing resist film 49, second field oxide film 12 of a thickness of 500 Å to 1000 Å is formed under the condition of a thermal treatment temperature of 950° C. to 1100° C. with an LOCOS method, with silicon nitride film 46 used as a mask.

Figure 12:
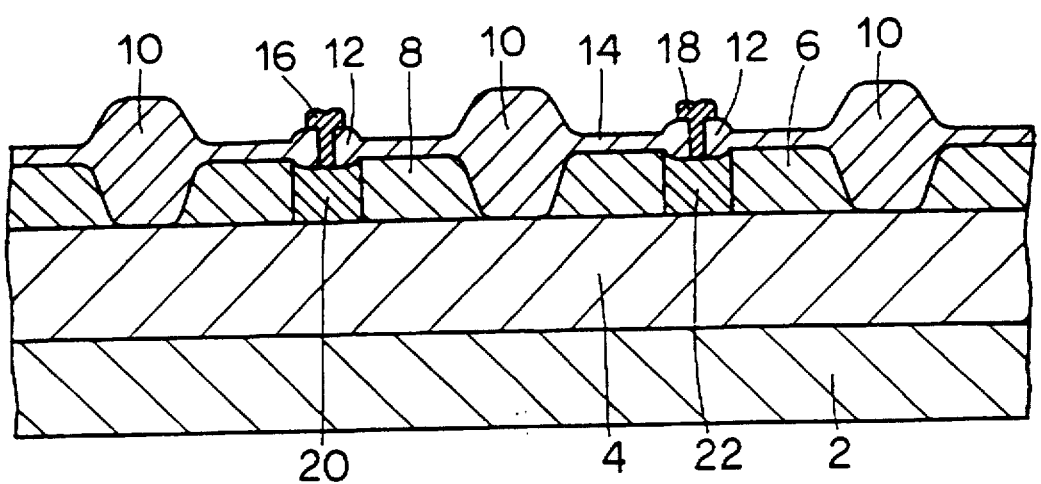

Referring to FIG. 12, after removing silicon nitride film 46, potential fixing electrodes 16, 18 reaching p type potential fixing region 20 and n type potential fixing region 22, respectively, are formed in second field oxide film 12, which completes the semiconductor device shown in FIG. 2. By using the above steps, it is possible to form two kinds of field oxide films different in thickness.

Description will now be given of the third embodiment of the present invention with reference to FIGS. 13 to 19. The third embodiment corresponds to a second method of manufacturing the semiconductor device shown in FIGS. 1 and 2.

Figure 13:
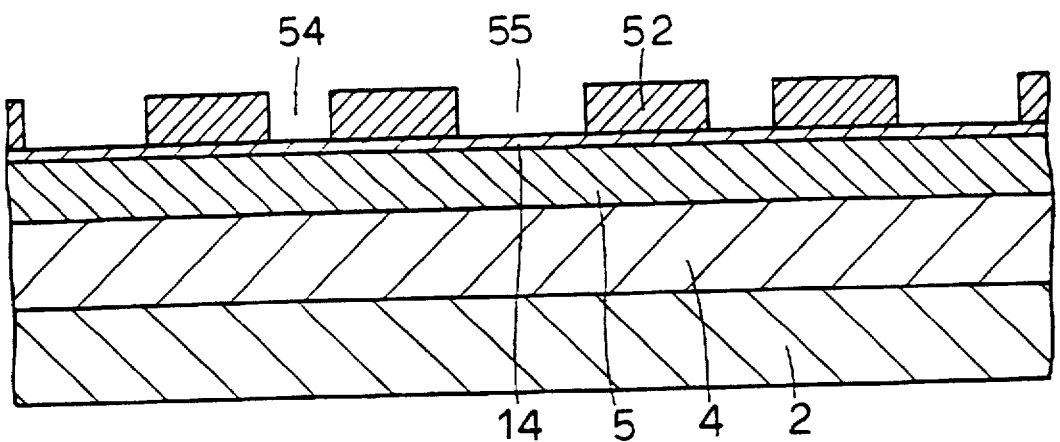
FIGS. 13 to 19 are sectional views showing the first to the seventh manufacturing steps of a semiconductor device according to a third embodiment of the present invention.

Referring to FIG. 13, buried oxide film 4 of a thickness 3800 Å to 4200 Å is formed on silicon substrate 2 under the conditions of an oxygen ion concentration of $1\times10^{18}$ cm$^{-3}$, energy of approximately 180 keV, and a thermal treatment temperature of 1300° C. to 1350° C. SOI layer 5 of a thickness to 500 Å to 1000 Å is then formed on buried oxide film 4 under the conditions of an oxygen ion concentration of $1\times10^{18}$ cm$^{-3}$, energy of 180 keV, and a thermal treatment temperature of 1300° C. to 1350° C.

Figure 14:
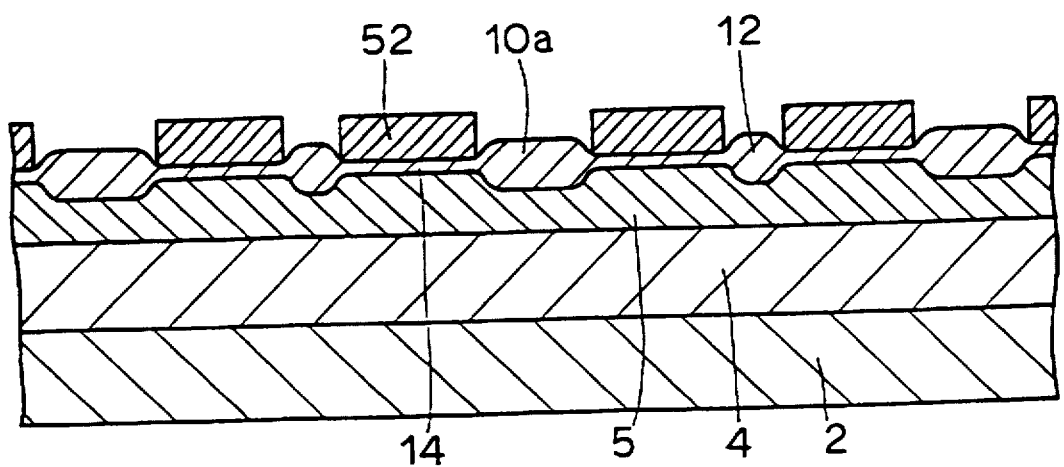

Silicon oxide film 14 of a thickness of 100 Å to 300 Å is formed on SOI layer 5 under the condition of a thermal treatment temperature of approximately 950° C. with a thermal oxidation method. On silicon oxide film 14, formed is a silicon nitride film 52 of a thickness of 500 Å to 2000 Å having a first opening portion 54 having a prescribed width and a second opening portion 55 having a width larger than that of first opening portion 54. Referring to FIG. 14, a first field oxide film 10a and second field oxide film 12 are formed under the condition of a thermal treatment temperature of 950° C. to 1100° C. with an LOCOS method, with silicon nitride film 52 used as a mask.

Figure 15:
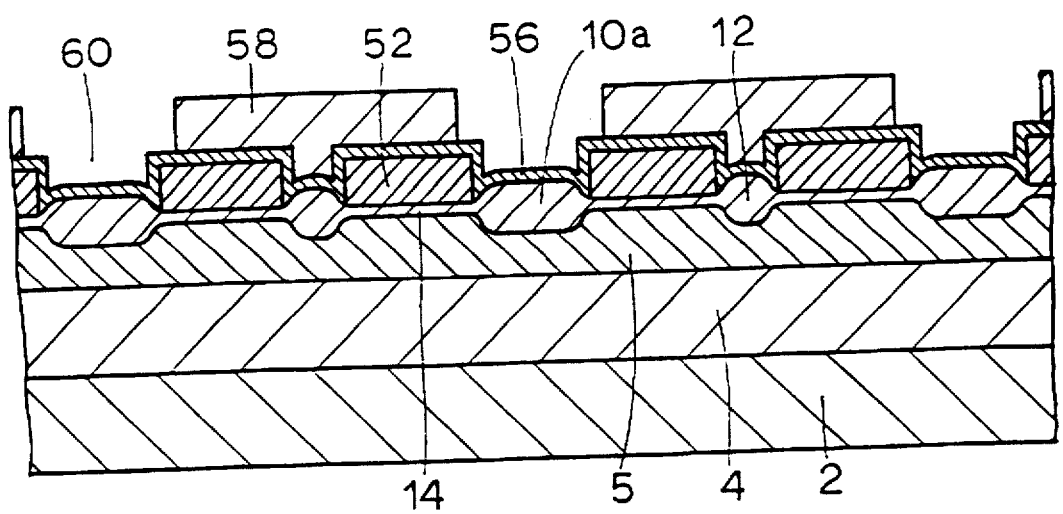

Referring to FIG. 15, a polysilicon layer 56 and a silicon nitride film 58 are deposited on the entire surface of silicon substrate 2. Only silicon nitride film 58 positioned over first field oxide film 10a is etched away. At this time, polysilicon layer 56 serves as an etching stopper.

Figure 16:
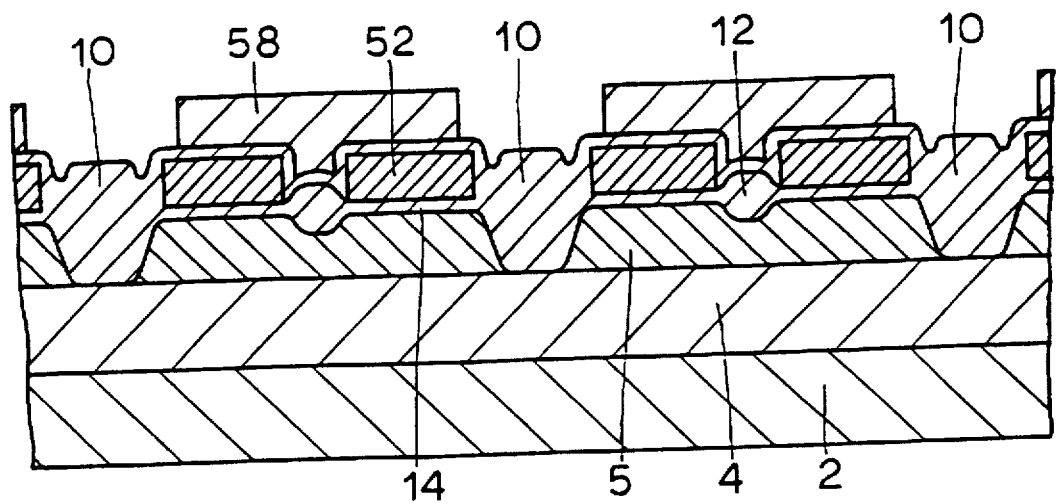
Figure 17:
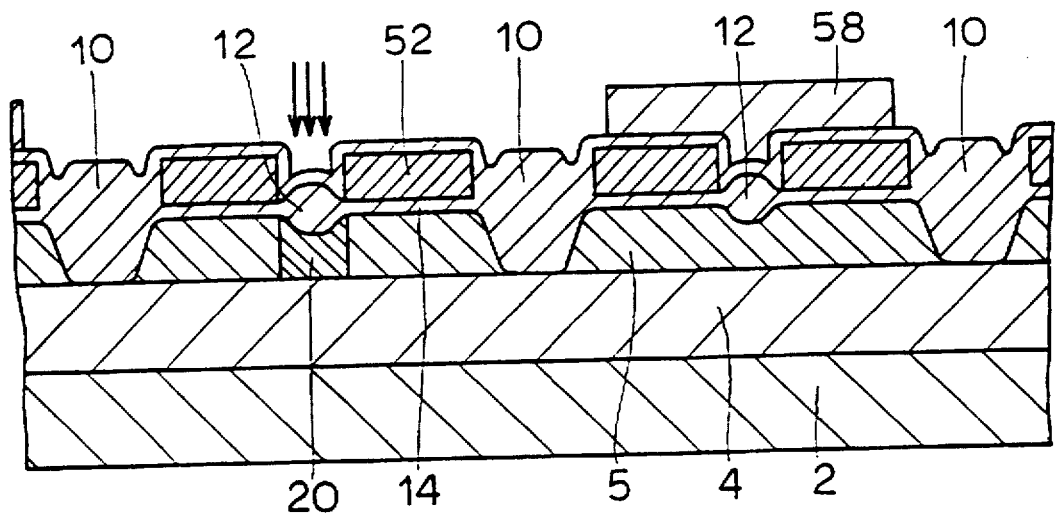
Figure 18:
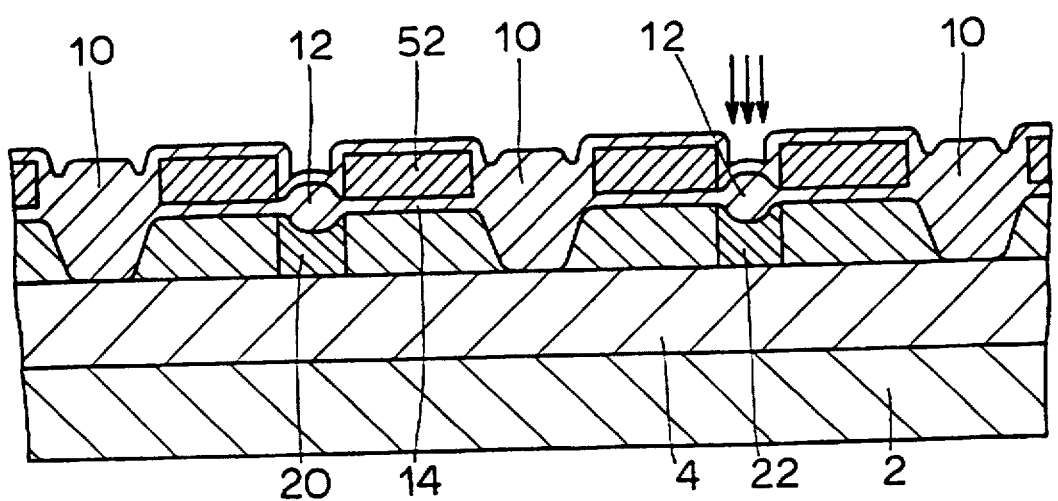

Referring to FIG. 16, with silicon nitride film 58 used as a mask, first field oxide film 10a is grown in thickness under the condition of a thermal treatment temperature of 950° C. to 1100° C. with an LOCOS method. First field oxide film 10 reaching buried oxide film 4 is thus completed. Referring to FIG. 17, boron ions are implanted into a region under second field oxide film 12 to form p type potential fixing region 20. Referring to FIG. 18, phosphorus ions are implanted into a region under second field oxide film 12 to form n type potential fixing region 22.

Figure 19:
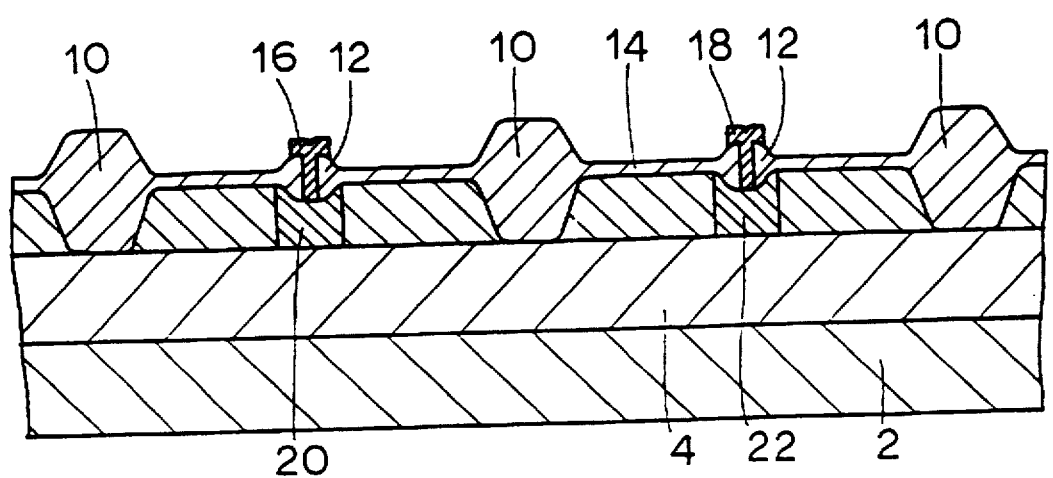

Referring to FIG. 19, potential fixing electrodes 16, 18 reaching p type potential fixing region 20 and n type potential fixing region 22, respectively, are formed in second field oxide film 12, which completes the semiconductor device shown in FIGS. 1 and 2. It is possible to form a first field oxide film and a second field oxide film different in thickness also with the above-described method.

Description will now be given of the fourth embodiment of the present invention with reference to FIGS. 20 to 26. The fourth embodiment corresponds to a third method of manufacturing the semiconductor device shown in FIGS. 1 and 2.

Figure 20:
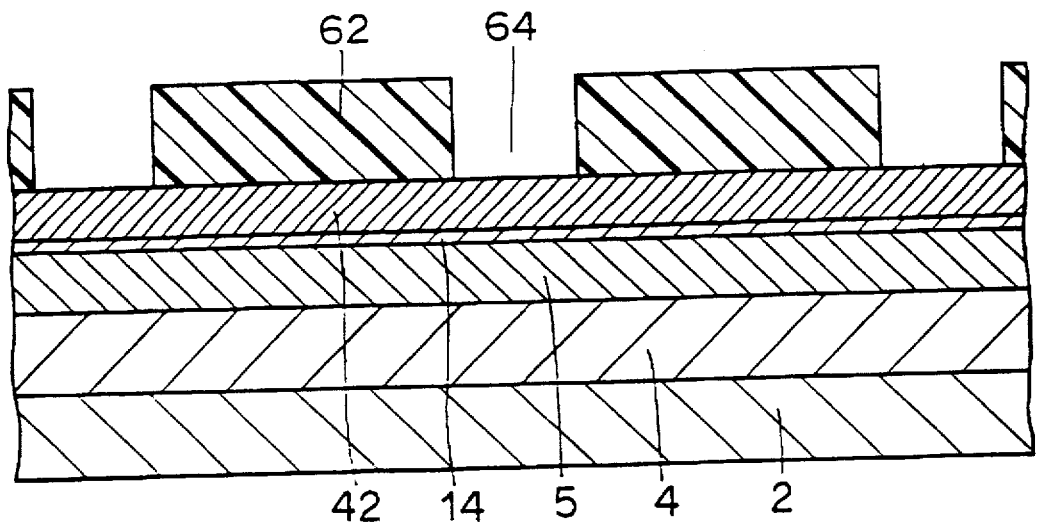
FIGS. 20 to 26 are sectional views showing first to the seventh manufacturing steps of a semiconductor device according to a fourth embodiment of the present invention.

Referring to FIG. 20, buried oxide film 4, SOI layer 5, silicon oxide film 14 and silicon nitride film 42 are formed on silicon substrate 2 with a method similar to the case of the second embodiment. A resist film 62 having a prescribed opening portion 64 is then formed on silicon nitride film 42.

Figure 21:
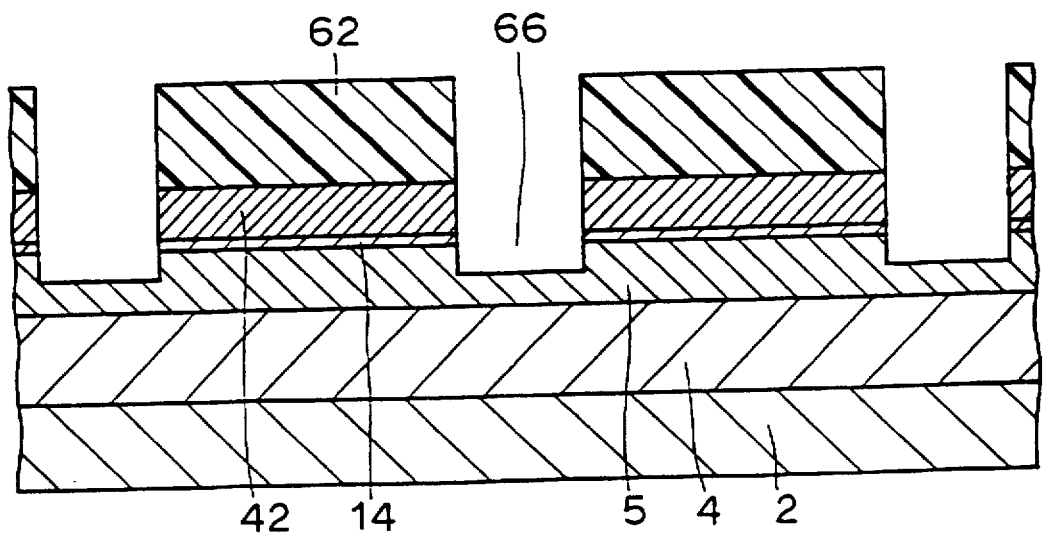
Figure 22:
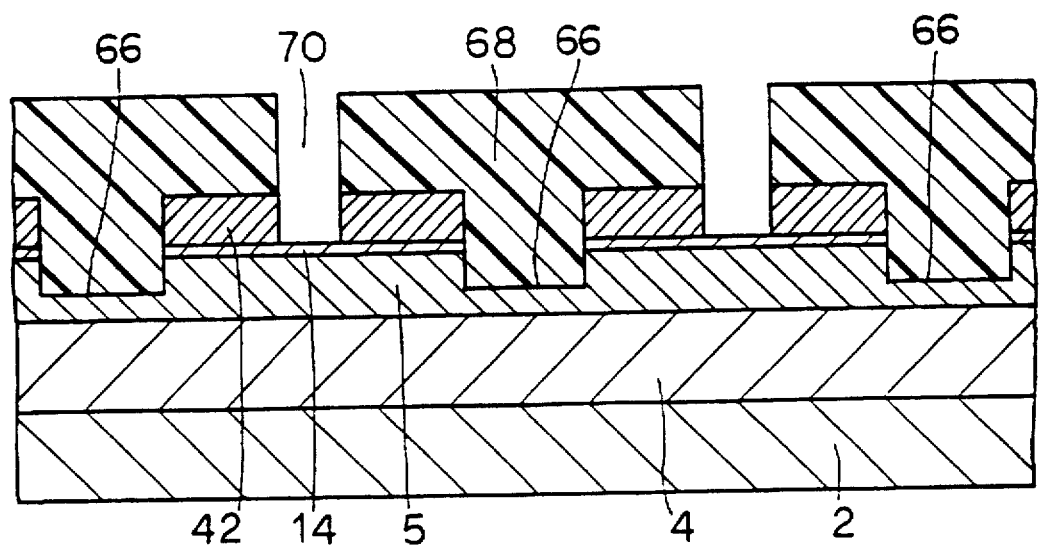

Referring to FIG. 21, with resist film 62 used as a mask, SOI layer 5 is etched to a prescribed depth to form a recessed portion 66 of a prescribed depth. Referring to FIG. 22, after removing resist film 62, a resist film 68 having a prescribed opening portion 70 is again formed. With resist film 68 used as a mask, nitride film 42 positioned between recessed portions 66 is patterned.

Figure 23:
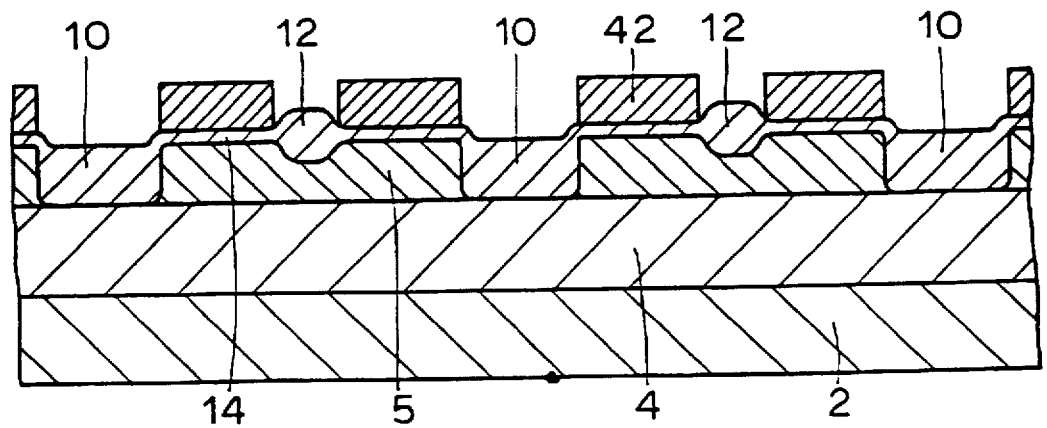

Referring to FIG. 23, after removing resist film 68, with nitride film 42 used as a mask, first field oxide film 10 and second field oxide film 12 are simultaneously formed with an LOCOS method. The bottom surface of first field oxide film 10 formed in recessed portion 66 reaches the top surface of buried oxide film 4.

Figure 24:
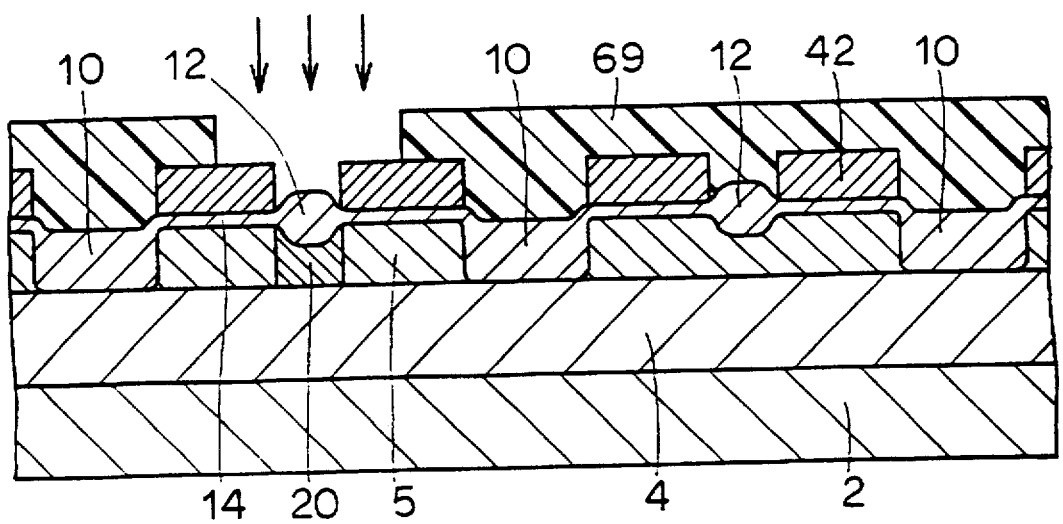

Referring to FIG. 24, impurities such as boron are implanted into a region under one of second field oxide films 12 to form p type potential fixing region 20.

Figure 25:
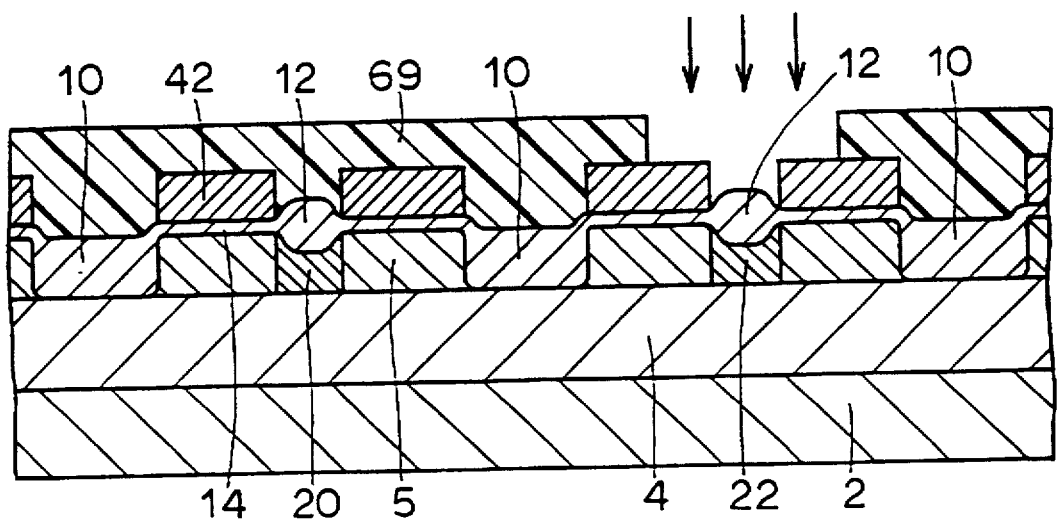

Referring to FIG. 25, impurities such as phosphorus are implanted into a region under another one of second field oxide films 12 to form n type potential fixing region 22.

Figure 26:
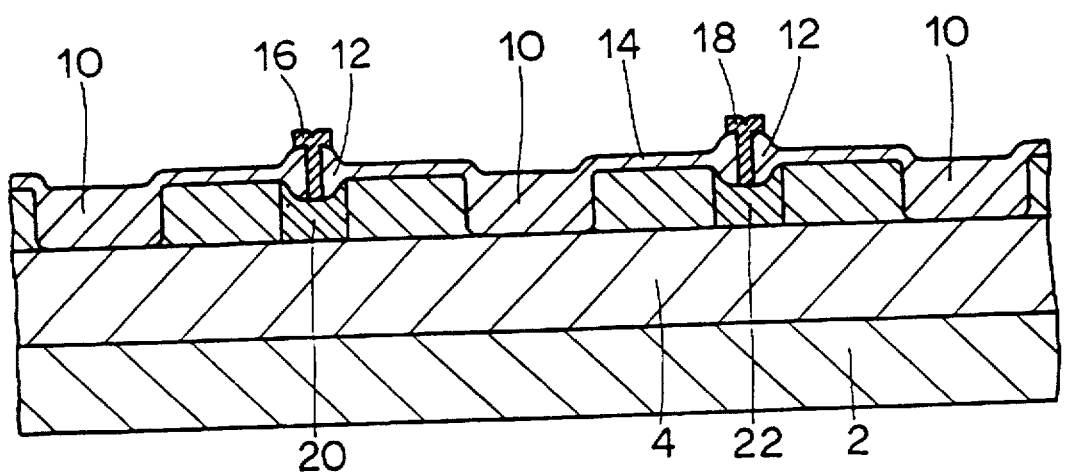

Referring to FIG. 26, potential fixing electrodes 16, 18 reaching p type potential fixing region 20 and n type potential fixing region 22, respectively, are formed on second field oxide film 12, which completes the semiconductor device shown in FIGS. 1 and 2. By using the above-described manufacturing method, two kinds of field oxide films 10, 12 different in thickness can be formed.

Description will now be given of the fifth embodiment of the present invention with reference to FIGS. 27 to 33. The fifth embodiment corresponds to a fourth method of manufacturing the semiconductor device shown in FIGS. 1 and 2.

Figure 27:
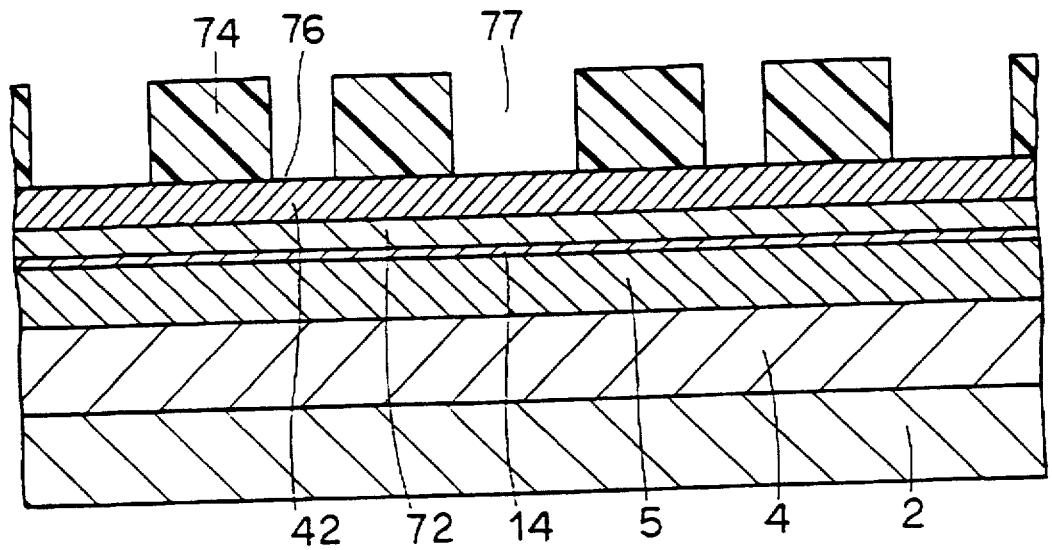
FIGS. 27 to 33 are sectional view showing the first to the seventh manufacturing steps of a semiconductor device according to a fifth embodiment of the present invention.

Referring to FIG. 27, buried oxide film 4, SOI layer 5 and silicon oxide film 14 are formed on silicon substrate 2 with a method similar to the case of the first embodiment. A polysilicon layer 72 of a thickness of 50 to 150 nm is formed on silicon oxide film 14. Silicon nitride film 42 of a thickness of approximately 500 Å to 2000 Å is formed on polysilicon layer 72. A resist film 74 having a first opening portion 76 and a second opening portion 77 larger in width than first opening portion 76 is formed on silicon nitride film 42.

Figure 28:
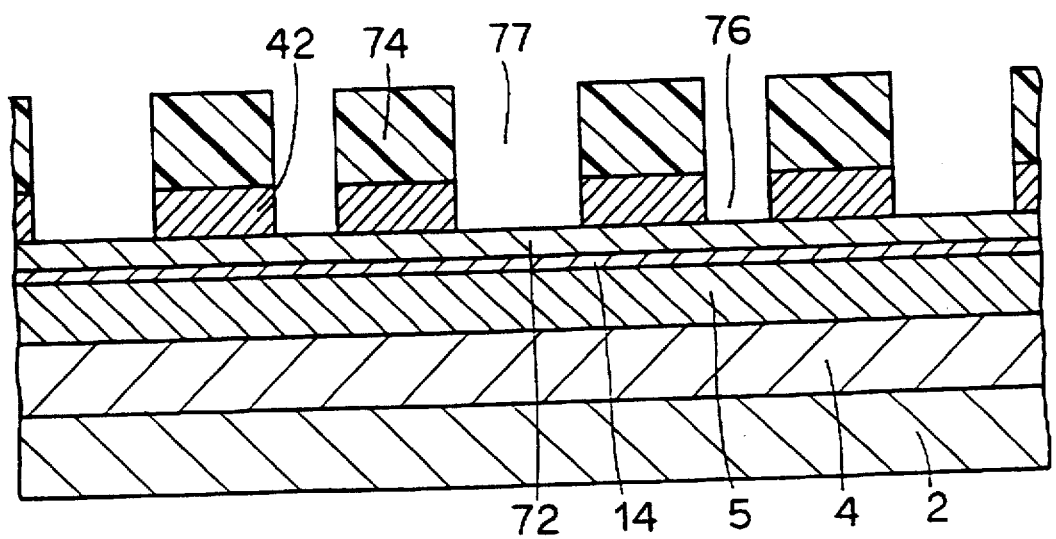
Figure 29:
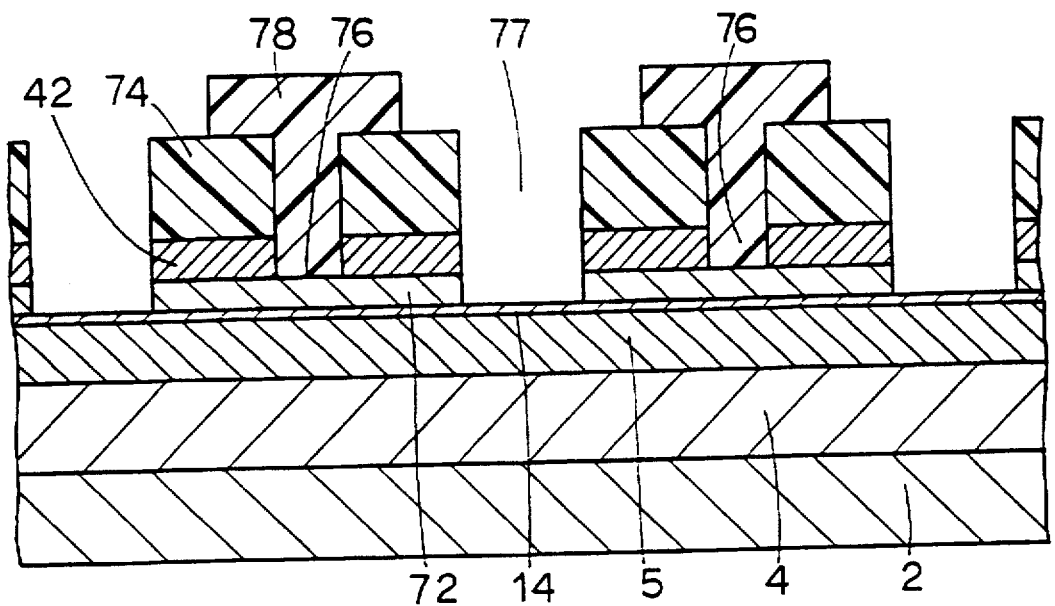

Referring to FIG. 28, with resist film 74 used as a mask, silicon nitride film 42 is patterned. Referring to FIG. 29, a second resist film 78 is formed so as to fill only first opening portion 76. With first resist film 74 and second resist film 78 used as a mask, polysilicon layer 72 is etched.

Figure 30:
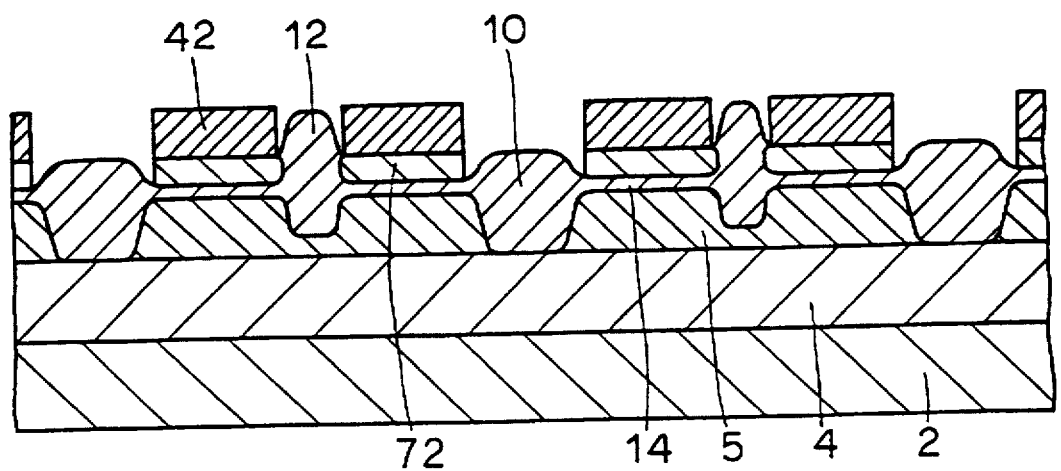
Figure 31:
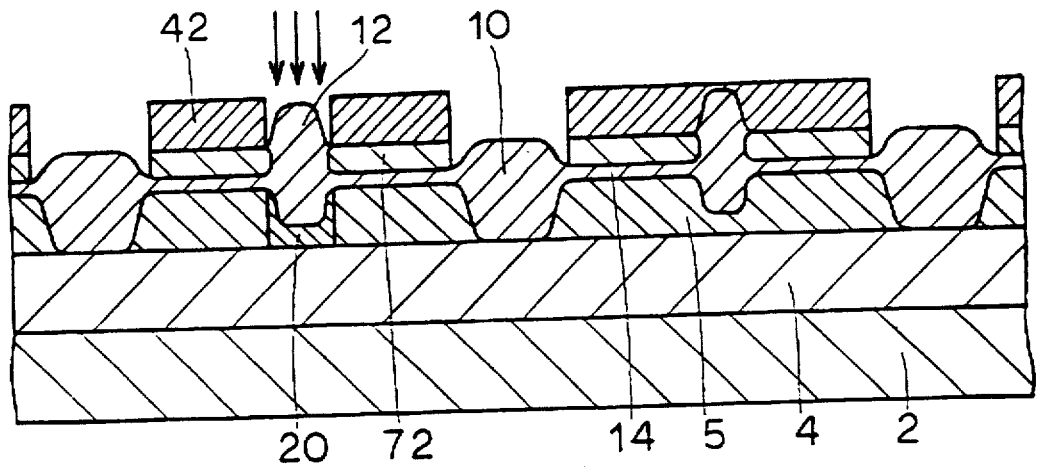
Figure 32:
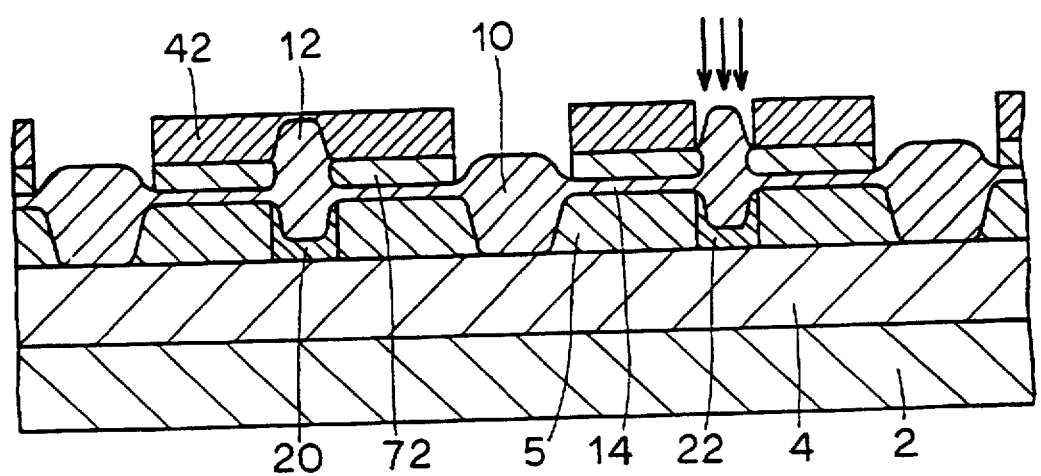

Referring to FIG. 30, after removing first resist film 74 and second resist film 78, with nitride film 42 used as a mask, first field oxide film 10 and second field oxide film 12 are formed with an LOCOS method. The bottom surface of field oxide film 10 reaches the top surface of buried oxide film 4. Referring to FIG. 31, by implanting impurities such as boron into a region under one of second field oxide films 12, p type potential fixing region 20 is formed. Referring to FIG. 32, by implanting impurities such as phosphorus into a region under another one of second field oxide films 12, n type potential fixing region 22 is formed.

Figure 33:
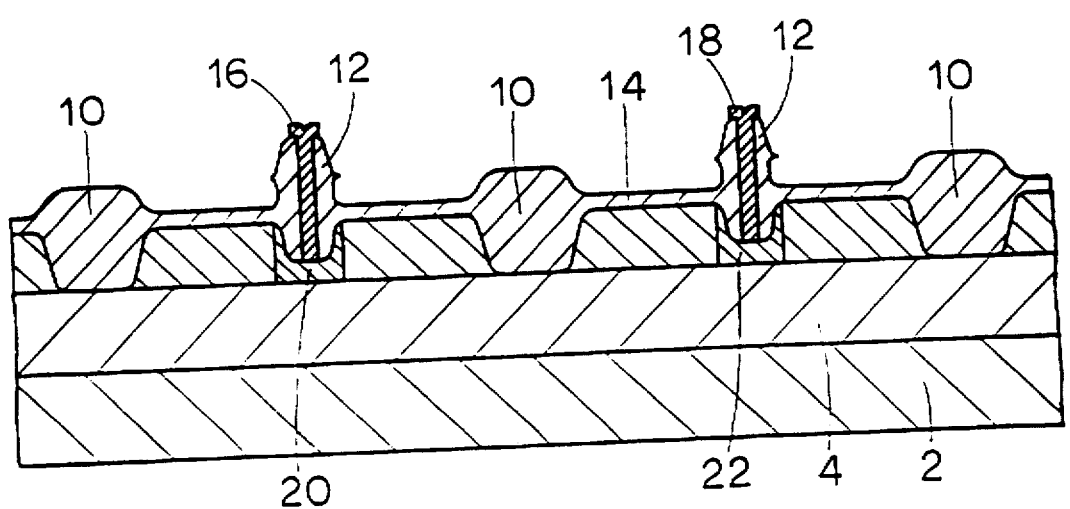

Referring to FIG. 33, formed are potential fixing electrodes 16, 18 reaching p type potential fixing region 20 and n type potential fixing region 22, respectively, formed in the regions under second field oxide films 12, which completes the semiconductor device shown in FIGS. 1 and 2. It is possible to form first field oxide film 10 and second field oxide film 12 different in thickness also with the above-described manufacturing method.

Description will now be given of the sixth embodiment of the present invention with reference to the drawings. Although an isolation method using a field oxide film was shown in the above first to fifth embodiments, the case will be described in this embodiment where a mesa isolation method or a field shield isolation method is used. In the mesa isolation method, active regions are isolated with an SOI layer of an active region left and the other portions etched away. In the field shield isolation method, active regions are isolated by applying a voltage of 0V to a field shield gate electrode of an nMOS field effect transistor forming region so that current will not flow to n$^+$ layers on both sides of the field shield gate electrode.

Figure 34:
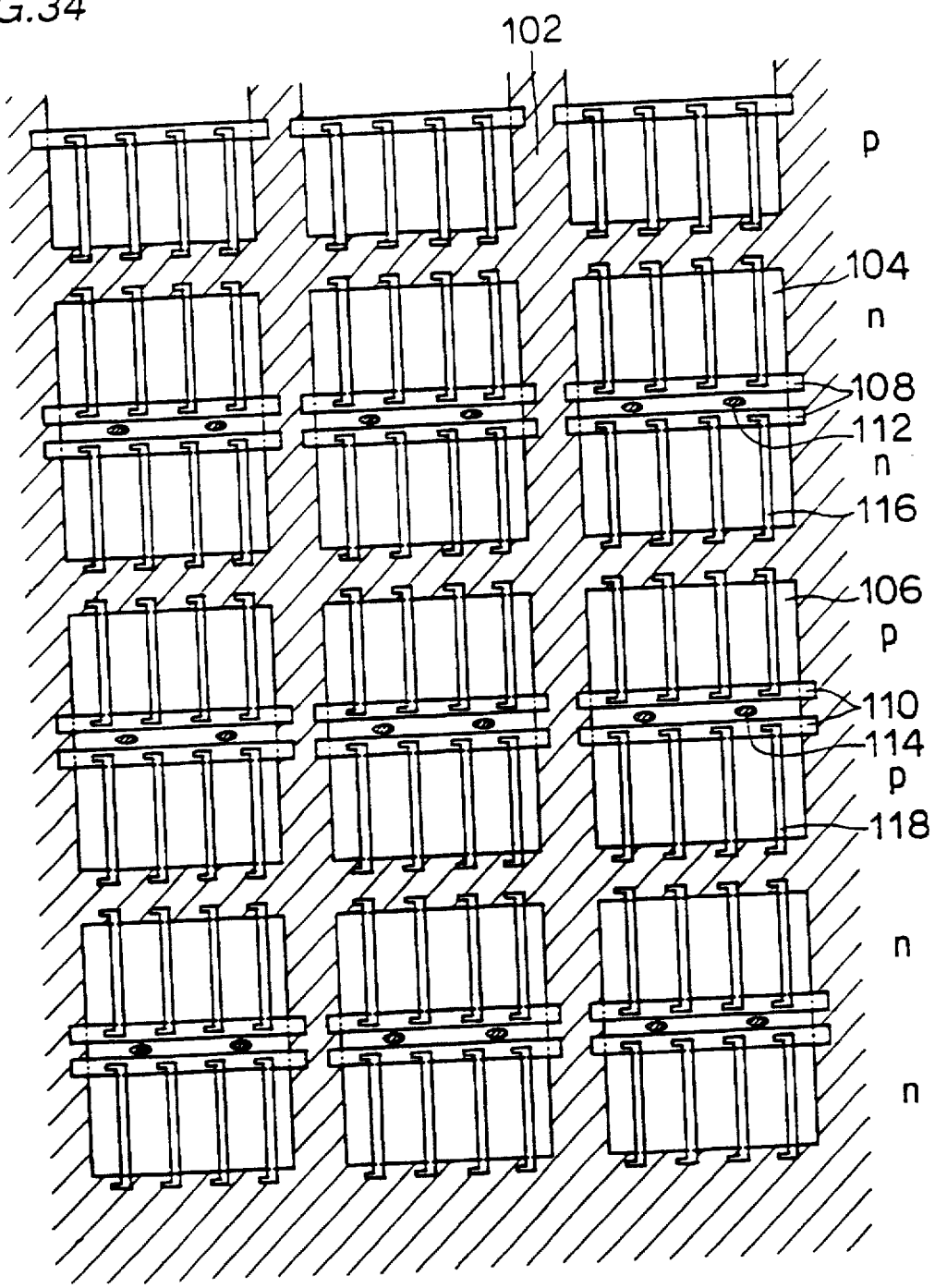
FIG. 34 is a plan view of a semiconductor device according to a sixth embodiment of the present invention.

Referring to FIG. 34, description will now be given of a plan structure of a semiconductor device in which active regions are isolated with the mesa isolation method and the field shield isolation method. An active region 104 of an nMOS field effect transistor and an active region 106 of a pMOS field effect transistor are electrically isolated by a mesa isolation region 102.

Gate electrodes 116 are disposed in active region 104 of the nMOS field effect transistor. Active region 104 is separated into two regions by a field shield gate electrode 108. Gate electrodes 118 are disposed in active region 106 of the pMOS field effect transistor. Active region 106 is separated into two regions by a field shield gate electrode 110. A p type contact region 112 is provided in active region 104 of the nMOS field effect transistor, and an n type contact region 114 is provided in active region 106 of the pMOS field effect transistor.

Impurity concentrations of p type contact region 112 and n type contact region 114 are set higher than that of the channel region. Even with a semiconductor device having a mesa isolation structure as described above, it is possible to obtain the similar effect as a semiconductor device having an isolation structure using field oxide films.

Description will now be given of the seventh embodiment of the present invention with reference to FIGS. 35 and 36. In a structure of the semiconductor device shown in the sixth embodiment, a leak current may flow at the sidewall portion of the isolated SOI layer when the active region of the field effect transistor is separated into two regions with a mesa isolation method. This is because an electric field concentration occurs at the edge portion of the SOI layer, lowering the threshold voltage at the sidewall and the corner portion of the SOI layer. In order to prevent this, the structure shown in FIGS. 35 and 36 can be used.

Referring to these figures, a buried oxide film 122 is formed on a silicon substrate 120. A channel region 124 of an nMOS field effect transistor of an SOI layer and a channel region 126 of a pMOS field effect transistor of an SOI layer are formed on buried oxide film 122. Gate electrode 116 is formed on channel region 124 of the nMOS field effect transistor with a silicon oxide film 132 interposed therebetween. Gate electrode 118 is formed on channel region 126 of the pMOS field effect transistor with a silicon oxide film 134 interposed therebetween.

Field shield gate electrode 108 is provided at an end surface portion of channel region 124 of the nMOS field effect transistor with silicon oxide film 132 interposed therebetween. Field shield gate electrode 108 is covered with an interlayer insulating film 136. On the other hand, field shield gate electrode 110 is provided at an end surface portion of channel region 126 of the pMOS field effect transistor with silicon oxide film 134 interposed therebetween. Field shield gate electrode 110 is covered with an interlayer insulating film 138.

Figure 35:
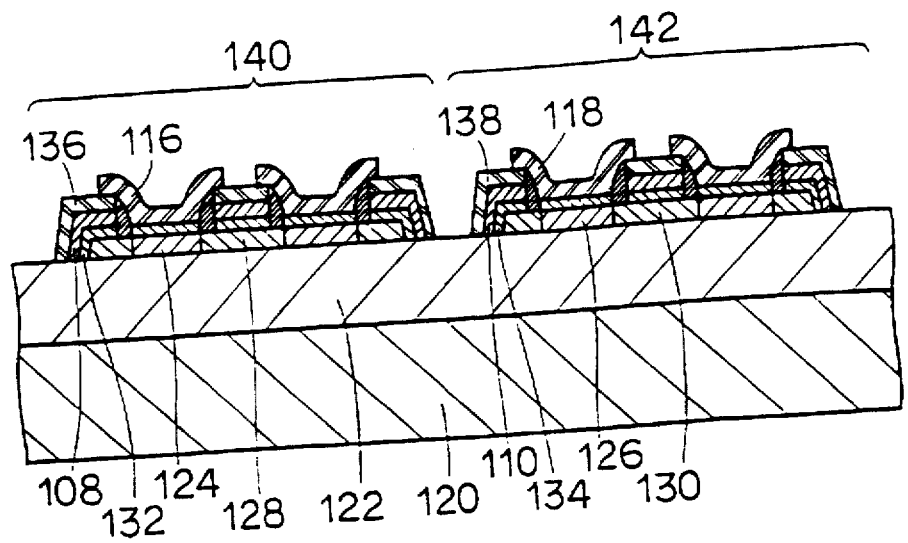
FIG. 35 is a sectional view of a semiconductor device according to a seventh embodiment of the present invention.
Figure 36:
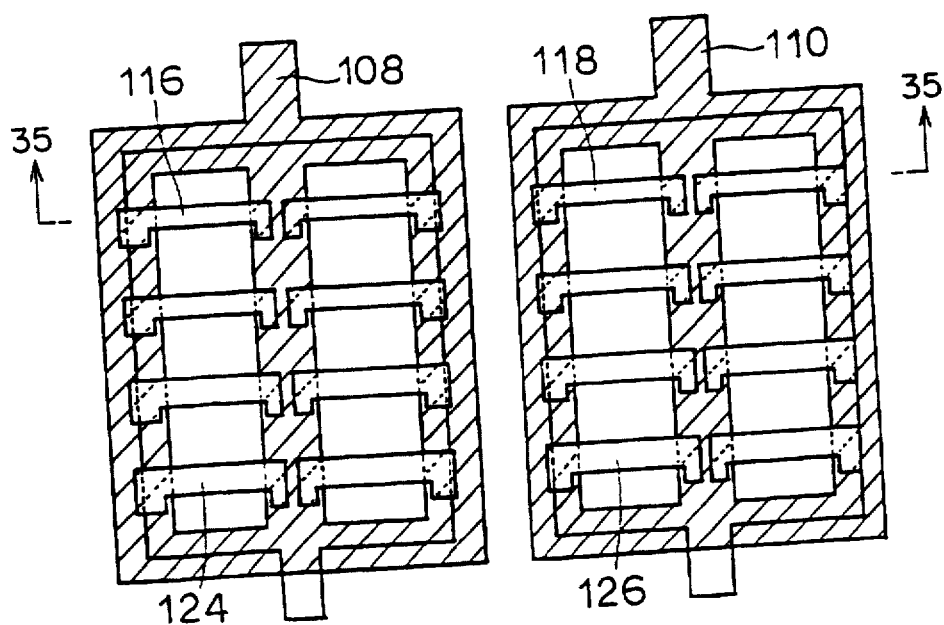
FIG. 36 is a plan view of the semiconductor device according to the seventh embodiment of the present invention.

As is shown in FIGS. 35 and 36, by providing a field shield gate electrode at an edge portion of an active region of a field effect transistor, a voltage applied to the field shield gate electrode is applied to the edge portion. Therefore, the potential at the edge portion of the SOI layer can be suppressed, preventing leakage current.

Figure 37:
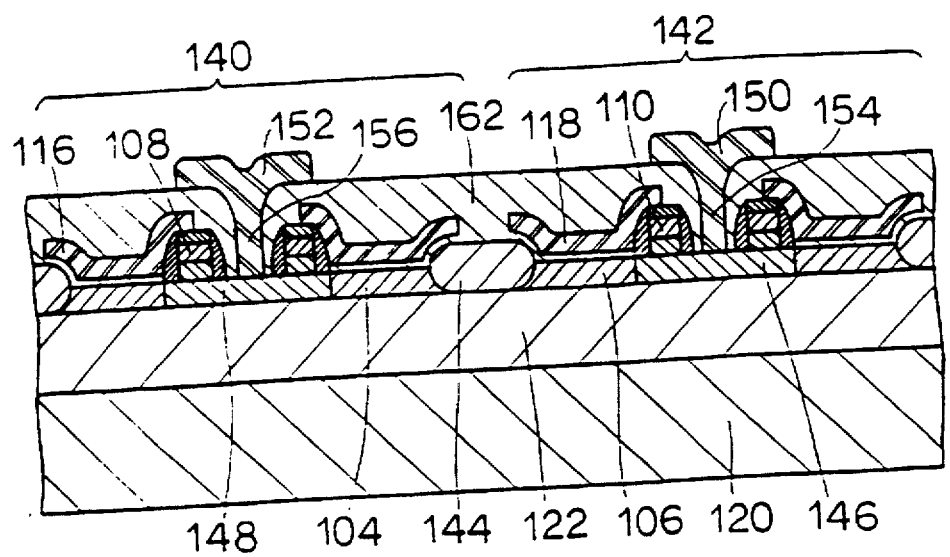
FIG. 37 is a sectional view of a semiconductor device according to an eighth embodiment of the present invention.
Figure 38:
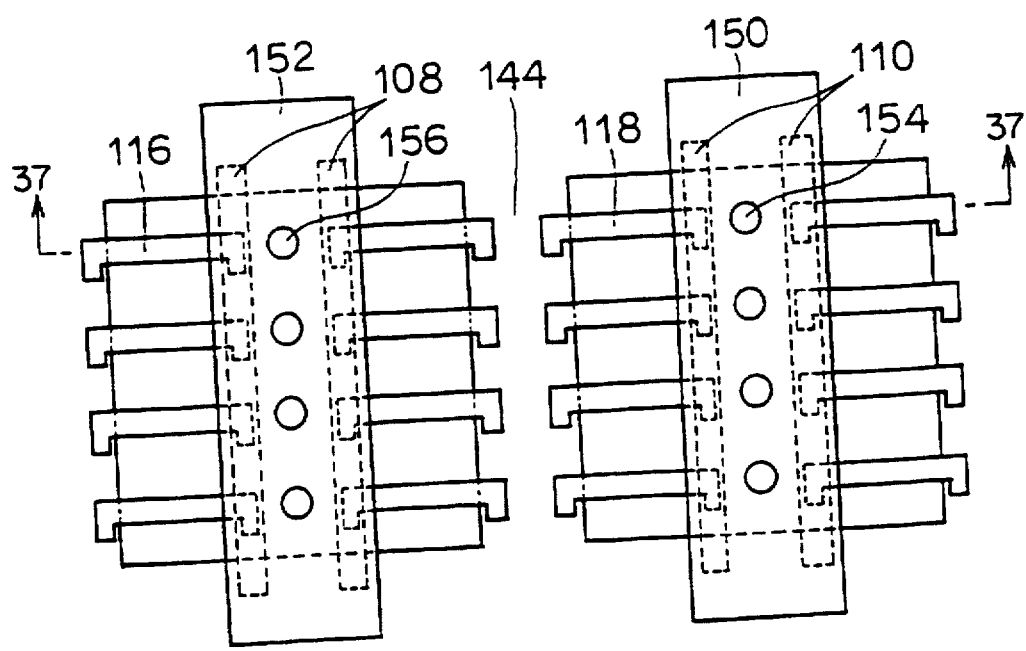
FIG. 38 is a plan view of the semiconductor device according to the eighth embodiment of the present invention.

Description will now be given of a method for improving the breakdown voltage between source and drain using a field shield isolation method with reference to FIGS. 37 and 38. FIG. 37 is a sectional view taken along the line A—A shown in FIG. 38.

Referring to these figures, buried oxide film 122 is formed on silicon substrate 120. An nMOS field effect transistor forming region 140 and a pMOS field effect transistor forming region 142 are formed on buried oxide film 122. nMOS field effect transistor forming region 104 and pMOS field effect transistor forming region 142 are insulated and isolated by an isolation oxide film 144. In order to separate each field effect transistor forming region into two regions, field shield gate electrodes 108, 110 are formed.

An SOI region 148 is formed in a region under field shield gate electrode 108 of nMOS field effect transistor forming region 140. An interconnection layer 152 and a contact layer 156 are connected to SOI region 148. As a result, the potential of SOI region 148 under field shield gate electrode 108 can be fixed. Also in pMOS field effect transistor forming region 142, an SOI region 146 is formed in a region under field shield gate electrode 110.

An interconnection layer 150 and a contact layer 154 are provided in SOI region 146. As a result, the potential of SOI region 146 under field shield gate electrode 110 can be fixed.

Therefore, SOI region 148, doped into p type, can be used for attracting holes generated by impact ionization. SOI region 146, doped into n type, can be used for attracting electrons generated by impact ionization. By using the above-described structure, latchup can be prevented completely. Simultaneously, it is possible to enhance the breakdown voltage between source and drain by fixing the potential under a channel of a transistor through a field shield portion.

Figure 39:
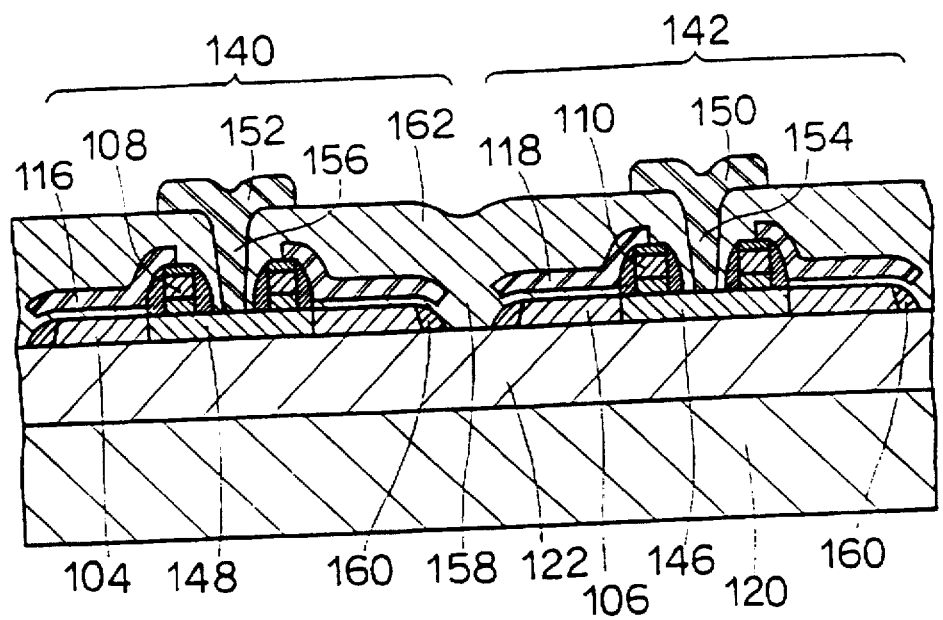
FIG. 39 is a sectional view of a semiconductor device according to a ninth embodiment of the present invention.
Figure 40:
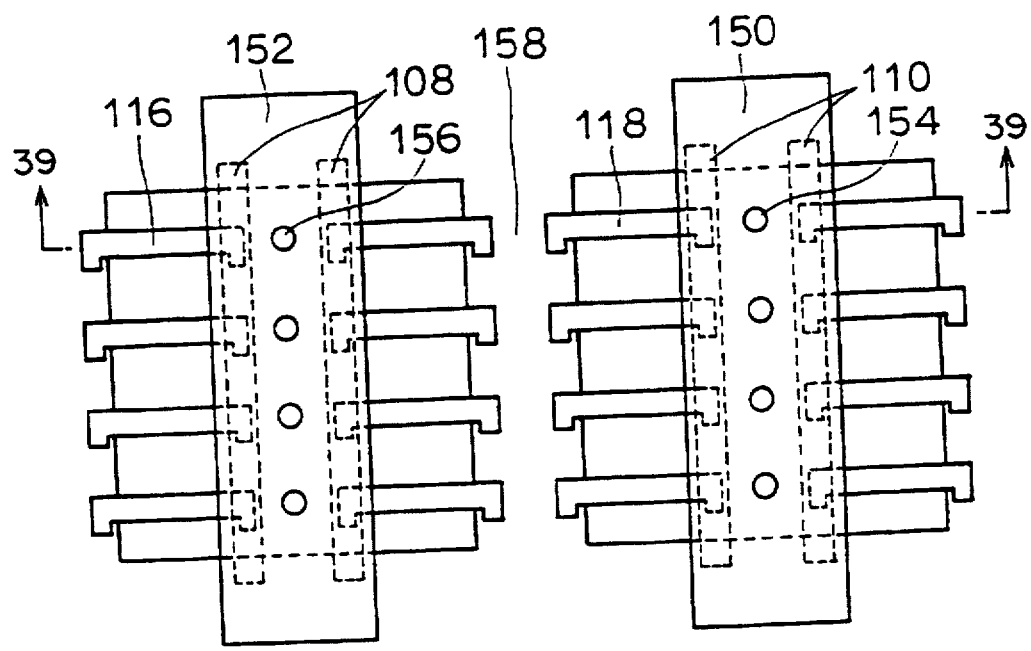
FIG. 40 is a plan view of the semiconductor device according to the ninth embodiment of the present invention.

Description will now be given of the ninth embodiment of the present invention with reference to FIGS. 39 and 40. In the above-described eighth embodiment, nMOS field effect transistor forming region 140 and pMOS field effect transistor forming region 142 were isolated with an isolation method using isolation oxide films. However, in this embodiment, a structure is shown in which these regions are isolated with a mesa isolation method. The other structure is similar to the case of the eight embodiment. It is possible to obtain the similar effects as those of the eighth embodiment even with the mesa isolation method.

Figure 41:
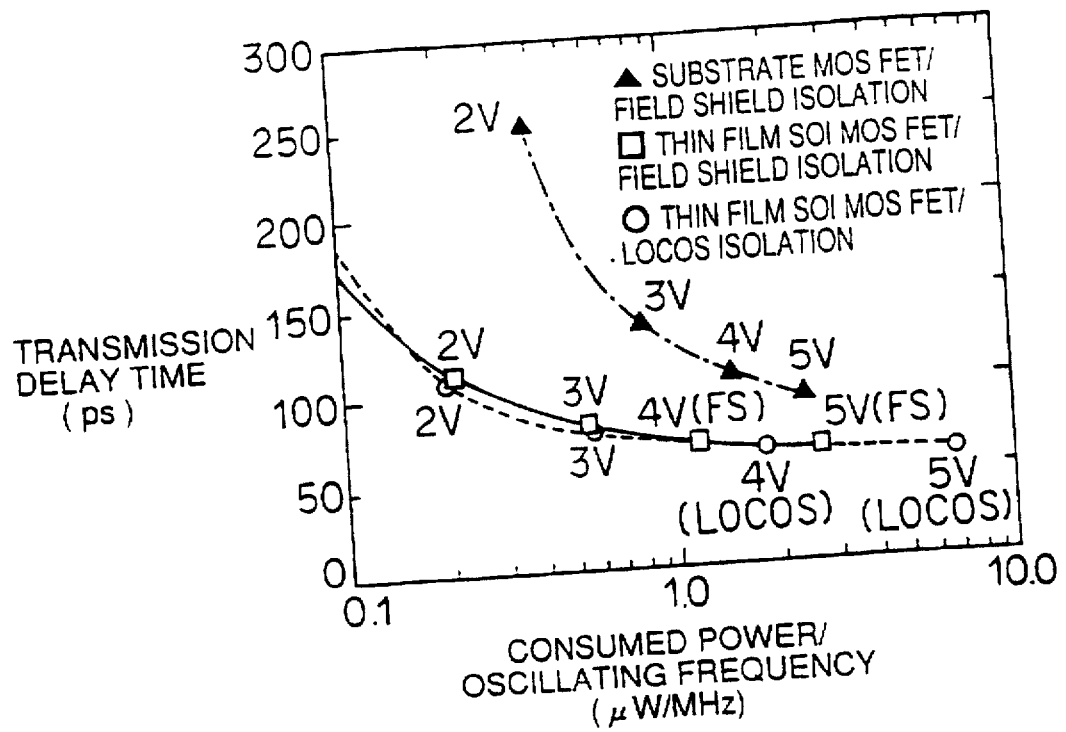
FIG. 41 is a first diagram showing the effect of the semiconductor device according to the present invention.

Referring to FIG. 41, description will be given of the characteristics of a semiconductor device in the structure of the above-described embodiments 6 to 9. In order to evaluate the characteristics, 53-stage CMOS ring oscillators are formed on a thin film SOI substrate and a bulk silicon substrate, and the delay times thereof are compared. The structure of isolation of the ring oscillator formed on the thin film SOI substrate includes a field shield isolation structure in which the potential of a channel region is fixed, and a field isolation structure in which the potential of a channel region is in a floating state.

These structures were compared with a field shield isolation structure of the ring oscillator formed on the bulk silicon substrate. In FIG. 41, the abscissa shows consumed power rated by oscillating frequency. The voltage is in the range of 2V to 5V. In this range of voltage, the delay time of the ring oscillator formed on the bulk silicon substrate is substantially larger than that formed on the thin film SOI layer. This is because the parasitic capacitance (junction capacitance) of the source/drain region is smaller in the ring oscillator formed on the thin film SOI substrate than in the ring oscillator formed on the bulk silicon substrate.

Figure 42:
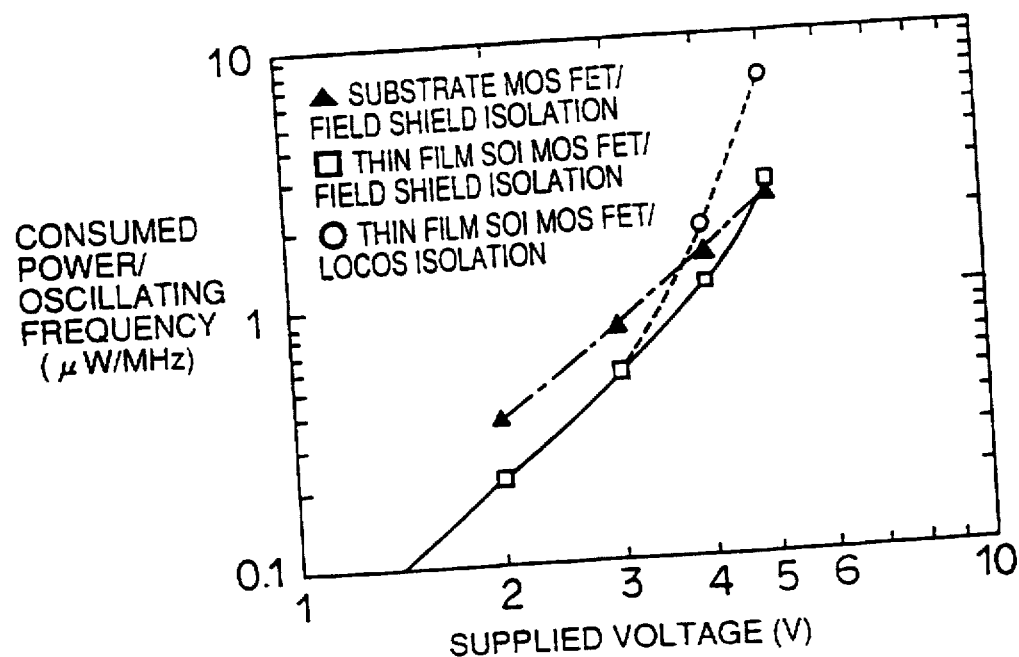
FIG. 42 is a second diagram showing the effect of the semiconductor device according to the present invention.

Referring to FIG. 42, description will be given of the relationship between the power supply voltage and power consumed by the ring oscillators in the structure similar to the case of FIG. 41. As is the case of FIG. 41, power consumed by the ring oscillator formed on the bulk silicon substrate is substantially larger than that of the ring oscillator formed on the thin film SOI substrate. As to power consumption of the ring oscillators formed on the thin film SOI substrate having a field shield isolation structure and a field isolation structure, respectively, when the power supply voltage is low (2–3V), there is no difference in power consumption between the oscillators. However, when the power supply voltage is high (4–5V), power consumption of the ring oscillator having the field isolation structure becomes larger than that of the ring oscillator formed on the bulk silicon substrate. The characteristic of low power consumption, which the SOI substrate structure originally has, cannot be obtained.

This is caused by decrease of the breakdown voltage between source and drain by parasitic bipolar operation, as described above. By fixing the substrate potential in the field shield isolation structure, attracting holes stored in the channel region, and improving the breakdown voltage between source and drain, the ring oscillator formed on the SOI substrate can implement power consumption lower than that of the ring oscillator formed on the bulk silicon substrate for the power supply voltage up to 5V.

As described above, in the semiconductor device in which the substrate potential is fixed, it is possible to maintain the characteristic of the SOI structure, and to prevent lowering of the breakdown voltage between source and drain, which was the largest shortcoming of the MOS field effect transistor formed on the SOI substrate. Even under the high power supply voltage, a circuit formed on the SOI substrate can implement circuit operation similar to a circuit formed on the bulk silicon substrate.

Description will now be given of the tenth embodiment of the present invention with reference to FIGS. 43 to 48. In this embodiment, description will now be given on how to bring interconnection layer 152 and contact layer 156 into contact with SOI region 148 in nMOS field effect transistor forming region 140, and on how to bring interconnection layer 150 and contact layer 154 into contact with SOI region 146 in pMOS field effect transistor forming region 142.

In this embodiment, description will be given of the case where field shield gate electrode 110 (108), and SOI regions 146 (148) are set at different potentials. In this case, it is necessary to form field shield gate electrodes 110 (108) and interconnection layers 150 (152) so as not to be electrically in contact with each other.

In order to facilitate attraction of holes and electrons, region 146b (148b) in SOI region 146 (148), in contact with interconnection layer 150 (152) have an impurity concentration set higher than the other region 146a (148a).

Figure 45:
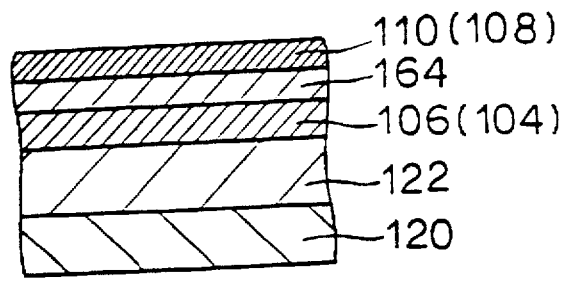
FIGS. 45 to 48 are sectional views showing the first to the fourth manufacturing steps of the semiconductor device according to the tenth embodiment of the present invention.

Description will now be given of the steps of manufacturing the semiconductor device shown in FIG. 43 with reference to FIGS. 45 to 48. Referring to FIG. 45, buried oxide film 122 is formed on silicon substrate 120. Active region 106 of an nMOS field effect transistor or active region 104 of an pMOS field effect transistor is formed on buried oxide film 122. Gate oxide film 164 is formed on active region 106 of the pMOS field effect transistor or active region 104 of the pMOS field effect transistor. Field shield gate layer 110 (108) is formed on gate oxide film 164.

Figure 46:
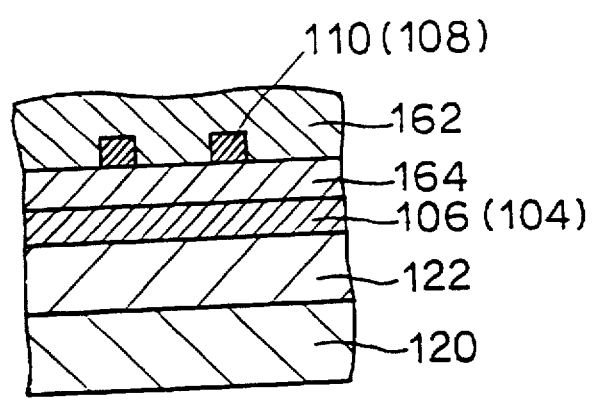
Figure 47:
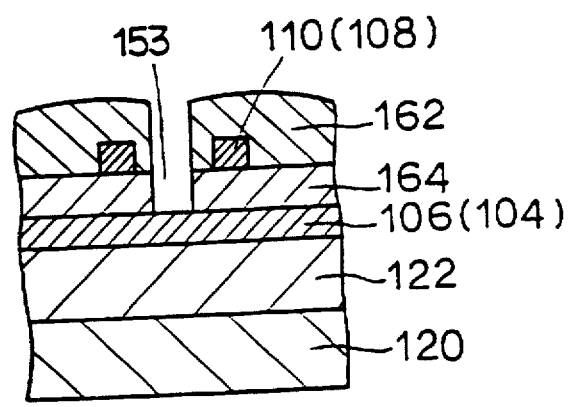
Figure 48:
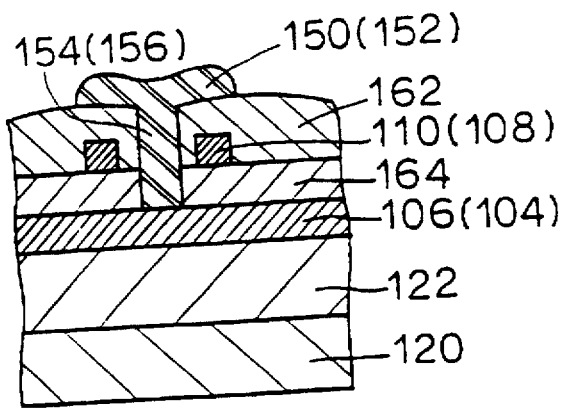

Referring to FIG. 46, field shield gate layer 110 (108) is patterned into a prescribed shape with a photolithography technology to form a field shield gate electrode 110 (108). The entire surface of silicon substrate 120 is covered with interlayer insulating film 162. Referring to FIG. 47, with the photolithography technology, a contact hole 153 is formed in a region between field shield gate electrodes 110 (108) exposing the surface of active region 106 of the nMOS field effect transistor or active region 104 of the pMOS field effect transistor. Referring to FIG. 48, contact layer 154 (156) is formed in contact hole 153. Interconnection layer 150 (152) is further formed in contact hole 153. As a result, a semiconductor device having the structure shown in FIG. 43 is completed.

Description will now be given of the eleventh embodiment of the present invention with reference to the drawings.

In the above-described tenth embodiment, field shield gate electrode 110 (108) and SOI region 146 (148) were set at different potentials. However, in this embodiment, field shield gate electrode 110 (108) and SOI region 146 (148) are set at the same potential.

Figure 43:
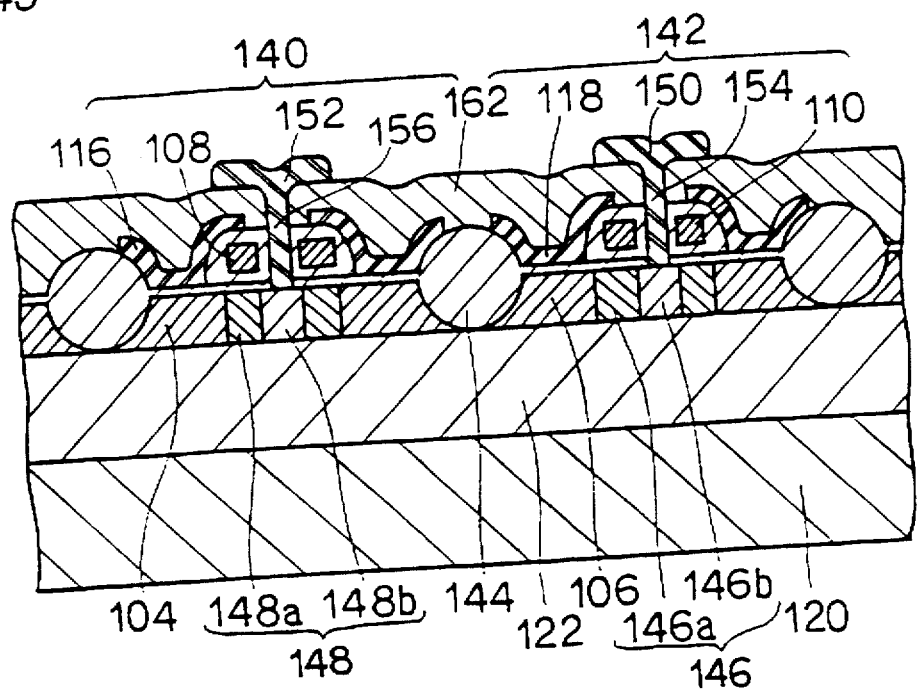
FIG. 43 is a sectional view of a semiconductor device according to a tenth embodiment of the present invention.
Figure 44:
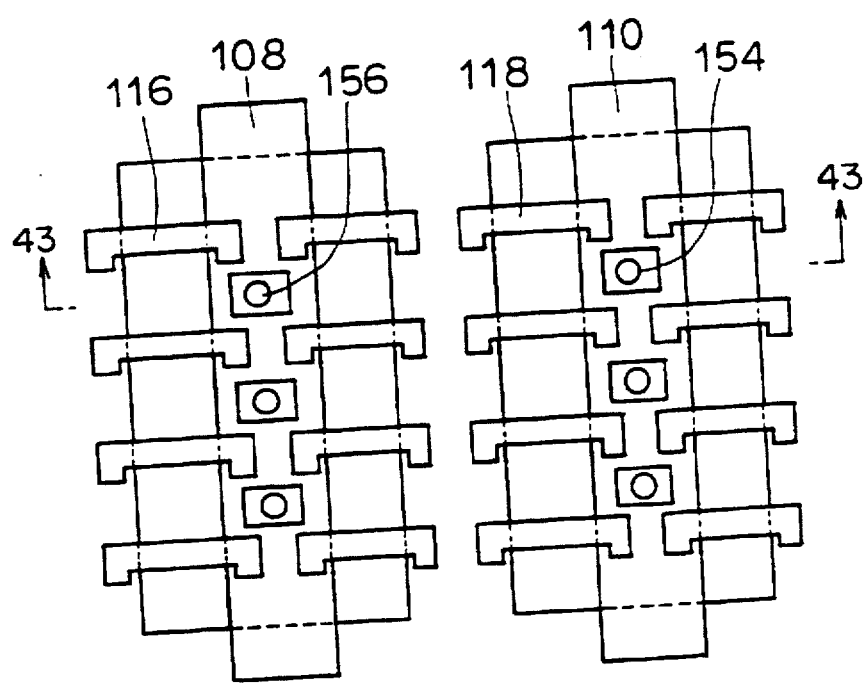
FIG. 44 is a plan view of the semiconductor device according to the tenth embodiment of the present invention.
Figure 49:
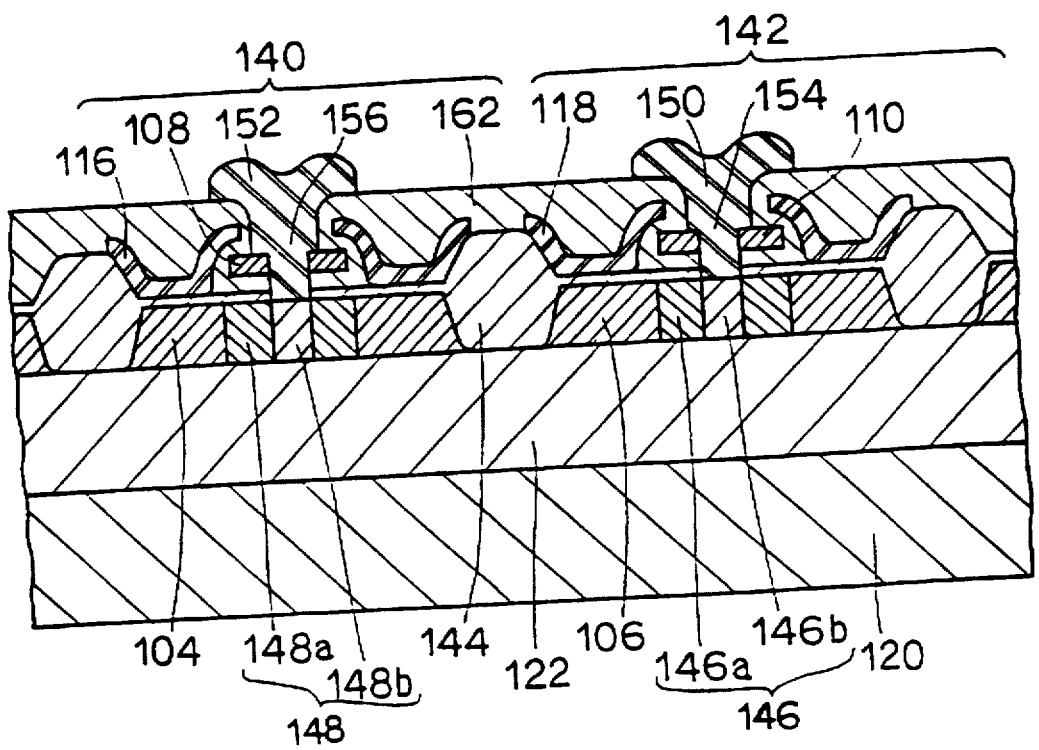
FIG. 49 is a sectional view of a semiconductor device according to an eleventh embodiment of the present invention.
Figure 50:
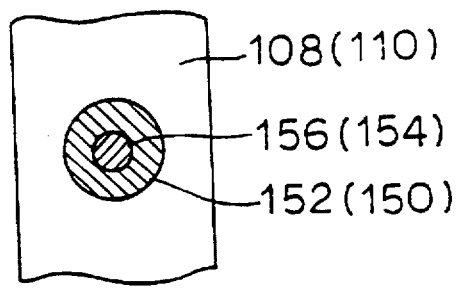
FIG. 50 is a first diagram showing the shape of a contact region of the semiconductor device according to the eleventh embodiment of the present invention.
Figure 51:
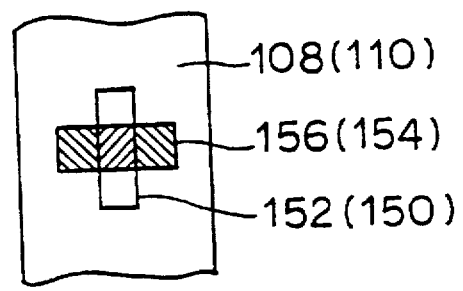
FIG. 51 is a second diagram showing the shape of the contact region of the semiconductor device according to the eleventh embodiment of the present invention.
Figure 52:
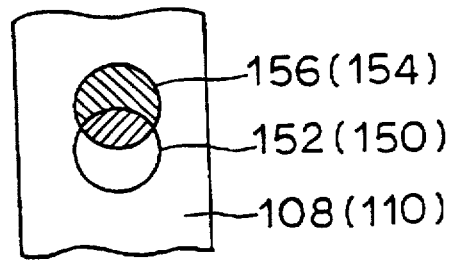
FIG. 52 is a third diagram showing the shape of the contact region of the semiconductor device according to the eleventh embodiment of the present invention.

Referring to FIG. 49, as compared to the structure shown in FIG. 43, field shield gate electrode 110 (108) and contact layer 154 (156) are disposed in contact with each other. As a result, the potential of field shield gate electrode 110 (108) and the potential of SOI region 146 (148) can be set at the same value. Interconnection layer 150 (152) and contact layer 154 (156) can be brought into contact with field shield gate electrode 110 (108) in various structures, whose plan shapes are shown in FIGS. 50 to 52.

Figure 53:
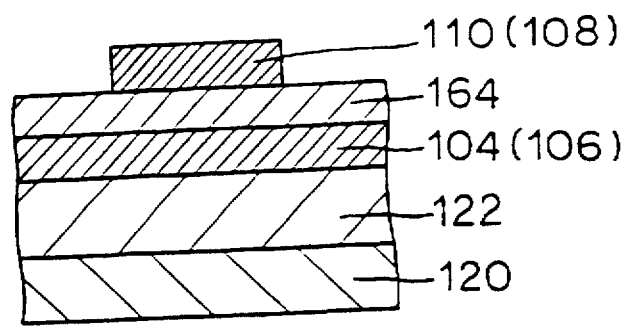
FIGS. 53 to 58 are sectional views showing the first to the sixth manufacturing steps of the semiconductor device according to the eleventh embodiment of the present invention.

Description will now be given of a method of manufacturing the structure shown in FIG. 49 with reference to FIGS. 53 to 58. Referring to FIG. 53, buried oxide film 122 is formed on silicon substrate 120. Active region 104 of the nMOS field effect transistor or active region 106 of the pMOS field effect transistor is formed on buried oxide film 122. Gate oxide film 164 is formed on active region 104 (106) of the field effect transistor. Field shield gate electrode 108 (110) patterned into a prescribed shape is formed on gate oxide film 164.

Figure 54:
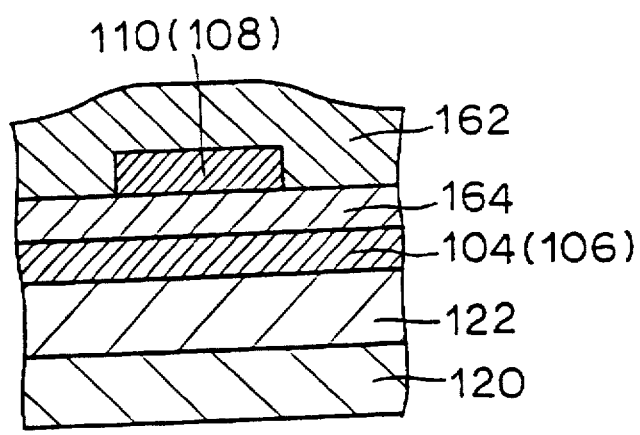
Figure 55:
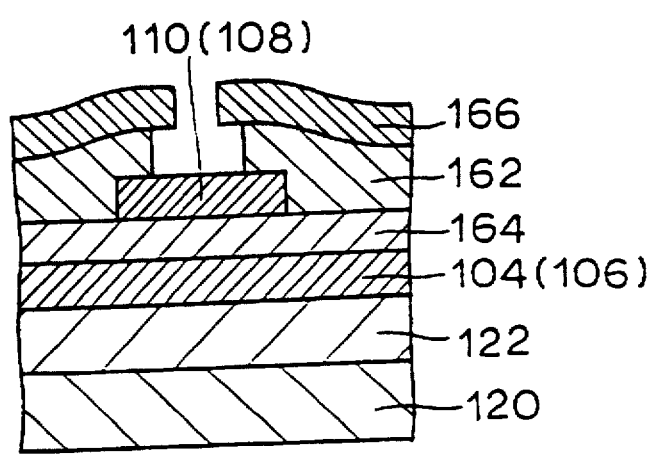

Referring to FIG. 54, the entire surface of silicon substrate 120 is covered with interlayer insulating film 162. Referring to FIG. 55, a resist film 166 having a prescribed pattern is formed on interlayer insulating film 162. A part of interlayer insulating film 162 is removed with anisotropic etching and isotropic etching.

Figure 56:
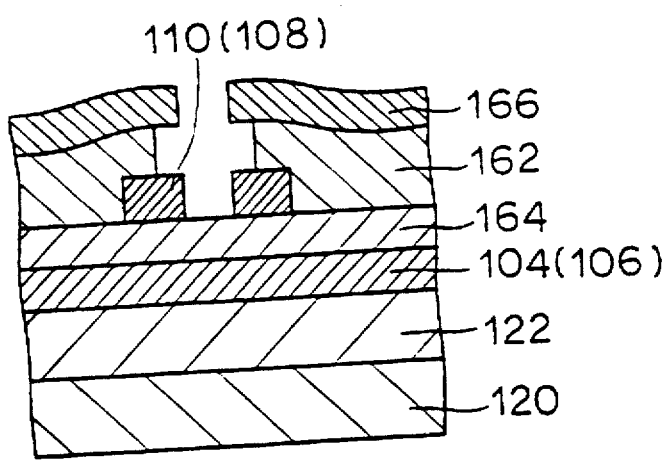
Figure 57:
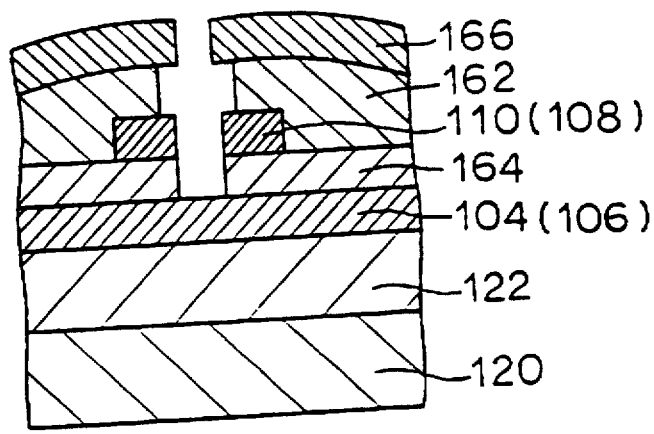
Figure 58:
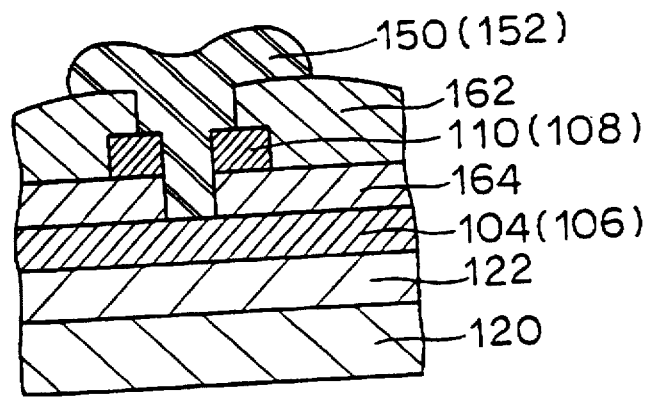

Referring to FIG. 56, with resist film 166 used as a mask, field shield gate electrode 110 (108) is patterned. Referring to FIG. 57, with resist film 166 used as a mask, silicon oxide film 164 is etched. Referring to FIG. 58, after removing resist film 166, interconnection layer 150 (152) is deposited, which completes a semiconductor device of the structure shown in FIG. 49.

Description will now be given of the twelfth embodiment of the present invention with reference to the drawings. In this embodiment, description will be given of the relationship between contact with the active region and contact with the field shield gate electrode.

Figure 59:
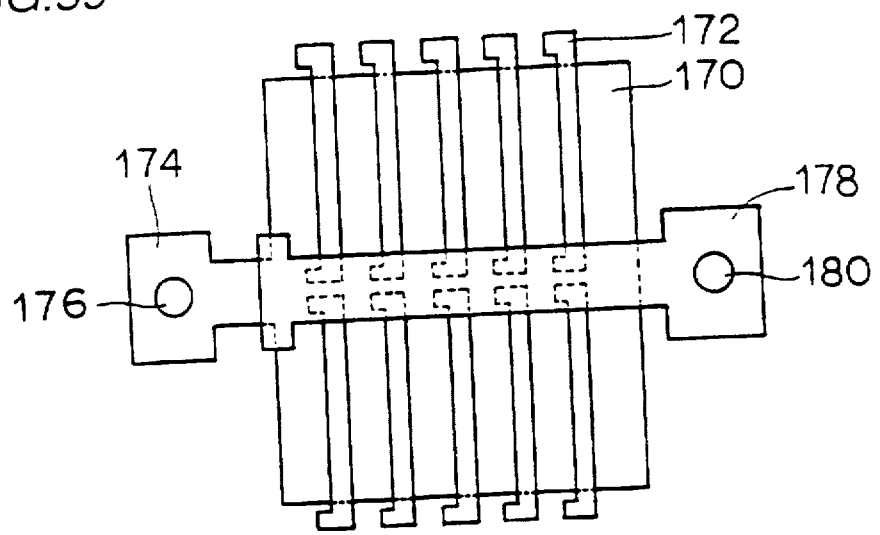
FIG. 59 is a first plan view of a semiconductor device according to a twelfth embodiment of the present invention.

Referring to FIG. 59, gate electrodes 172 are disposed at a prescribed position on active region 170. A field shield gate electrode 178 is provided on gate electrodes 172. A region 176 of contact with the active region (hereinafter referred to as a "body contact") and a body contact region 174, and a field shield gate electrode contact 180 are drawn out in opposite directions.

Figure 60:
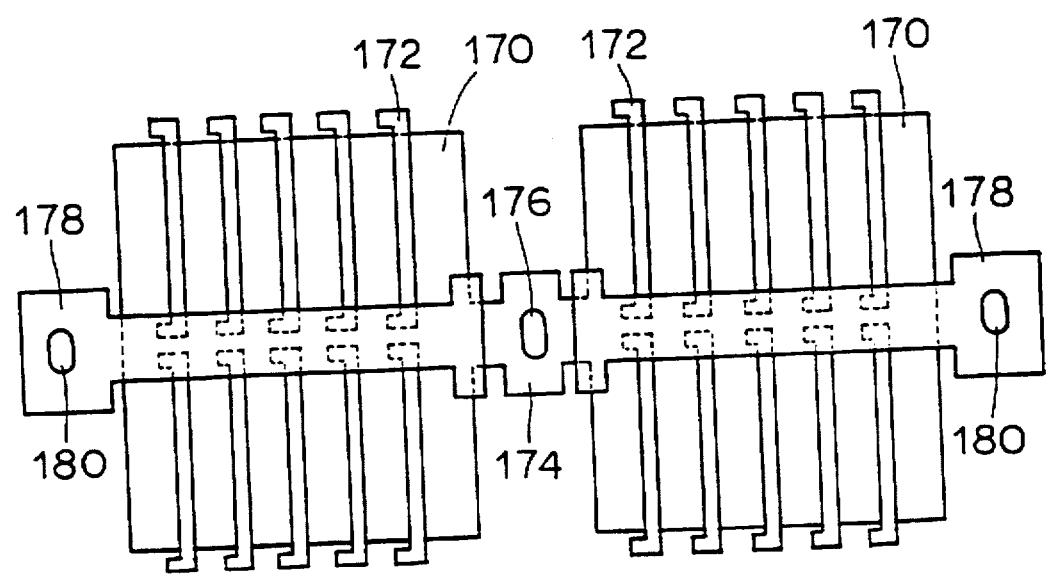
FIG. 60 is a second plan view of the semiconductor device according to the twelfth embodiment of the present invention.

Referring to FIG. 60, when active regions 170 are disposed in parallel, it is possible to provide field shield gate electrode contacts 180 of field shield gate electrodes 178 on opposite sides with body contact region 176 and body contact region 174 shared by these active regions.

Figure 61:
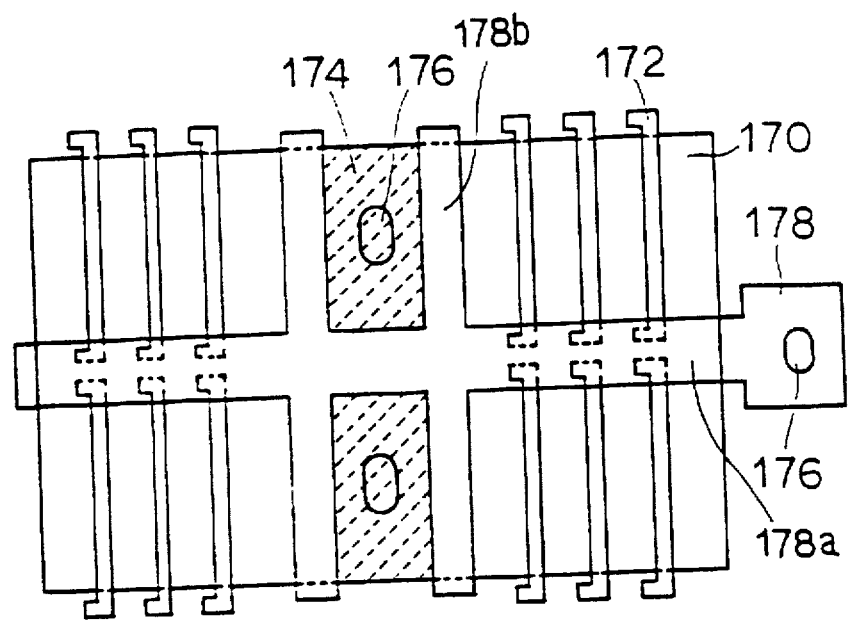
FIG. 61 is a plan view of a semiconductor device according to a thirteenth embodiment of the present invention.

Description will now be given of the thirteenth embodiment of the present invention with reference to FIG. 61. Although the body contact regions were provided outside active region 170 in the above-described twelfth embodiment, body contact regions are provided inside active region 170 in this embodiment.

Field shield gate electrode 178 according to this embodiment includes a main field shield gate electrode 178 extending in a direction orthogonal to a direction of gate electrodes 172 of the MOS field effect transistor, and two sub field shield gate electrodes 178b orthogonal to main field shield gate electrode 178a. Body contact region 176 is formed between two sub field shield gate electrodes 178b, to form body contact region 174. Impurities of the same conductivity type as that of the channel region of the field effect transistor are implanted into body contact region 174 at an impurity concentration higher than that of the channel region of the field effect transistor.

Figure 62:
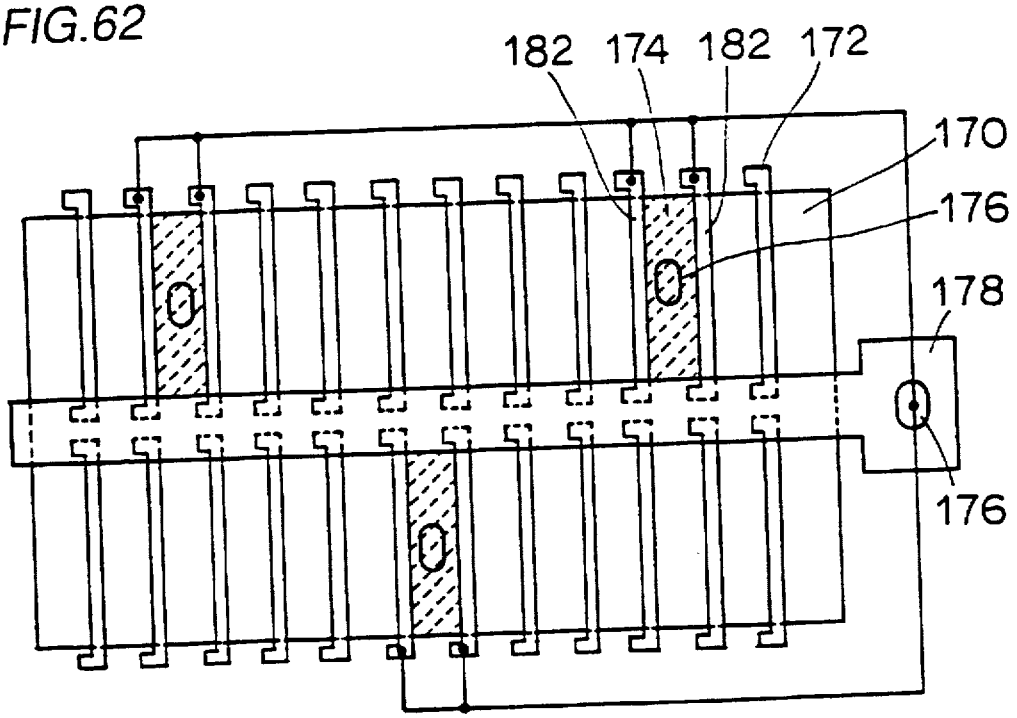
FIG. 62 is a plan view of a semiconductor device according to a fourteenth embodiment of the present invention.

Description will now be given of the fourteenth embodiment of the present invention with reference to FIG. 62. In this embodiment, two gate electrodes 182, among gate electrodes 172, not used as gate electrodes of the MOS field effect transistor are used as field shield gate electrodes for field shield isolation. By using such a structure, it is not necessary to form a new isolation region. Since the unused gate electrodes can be used, high integration of the semiconductor device can be implemented.

Figure 63:
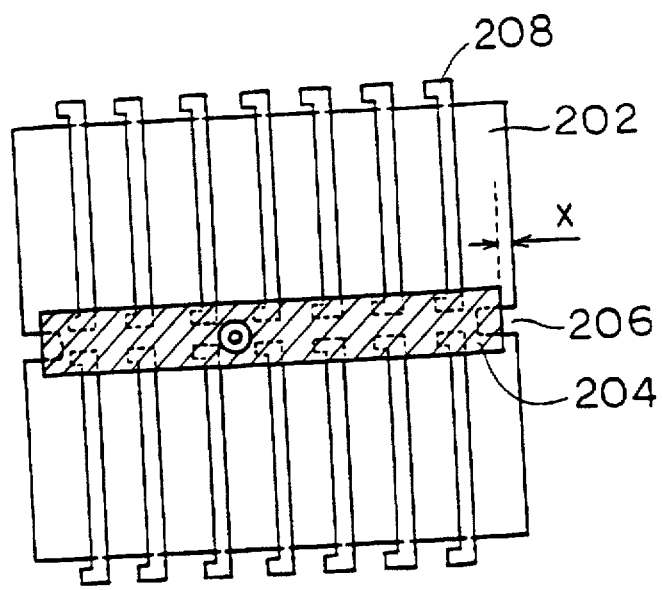
FIG. 63 is a first plan view of a semiconductor device according to a fifteenth embodiment of the present invention.

Description will now be given of the fifteenth embodiment of the present invention with reference to FIGS. 63 and 64. Referring to FIG. 63, according to the semiconductor device of this embodiment, gate electrodes 208 configuring an MOS field effect transistor are disposed on an active region 202. A field shield gate electrode 204 is disposed on gate electrodes 208.

As is clear from the structures of the twelfth to fourteenth embodiments described above, the field shield gate electrode must extend outside active region 202. However, in this embodiment, field shield gate electrode 204 does not extend outside active region 202. Instead, by providing a recessed portion 206 in active region 202 positioned under field shield gate electrode 204, field shield gate electrode 204 can be formed in active region 202.

Figure 64:
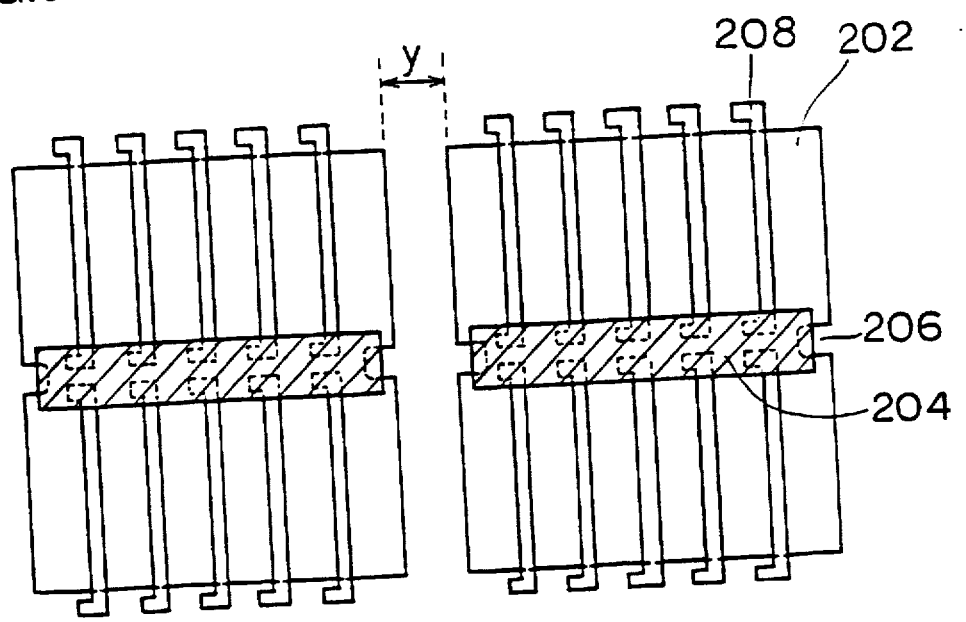
FIG. 64 is a second plan view of the semiconductor device according to the fifteenth embodiment of the present invention.

By providing field shield gate electrode 204 with recessed portion 206, referring to FIG. 64, it is possible to set a space y between active regions 202 at the minimum isolation width when active regions 202 are formed in parallel. Therefore, it is possible to implement high integration of the semiconductor device.

Figure 65:
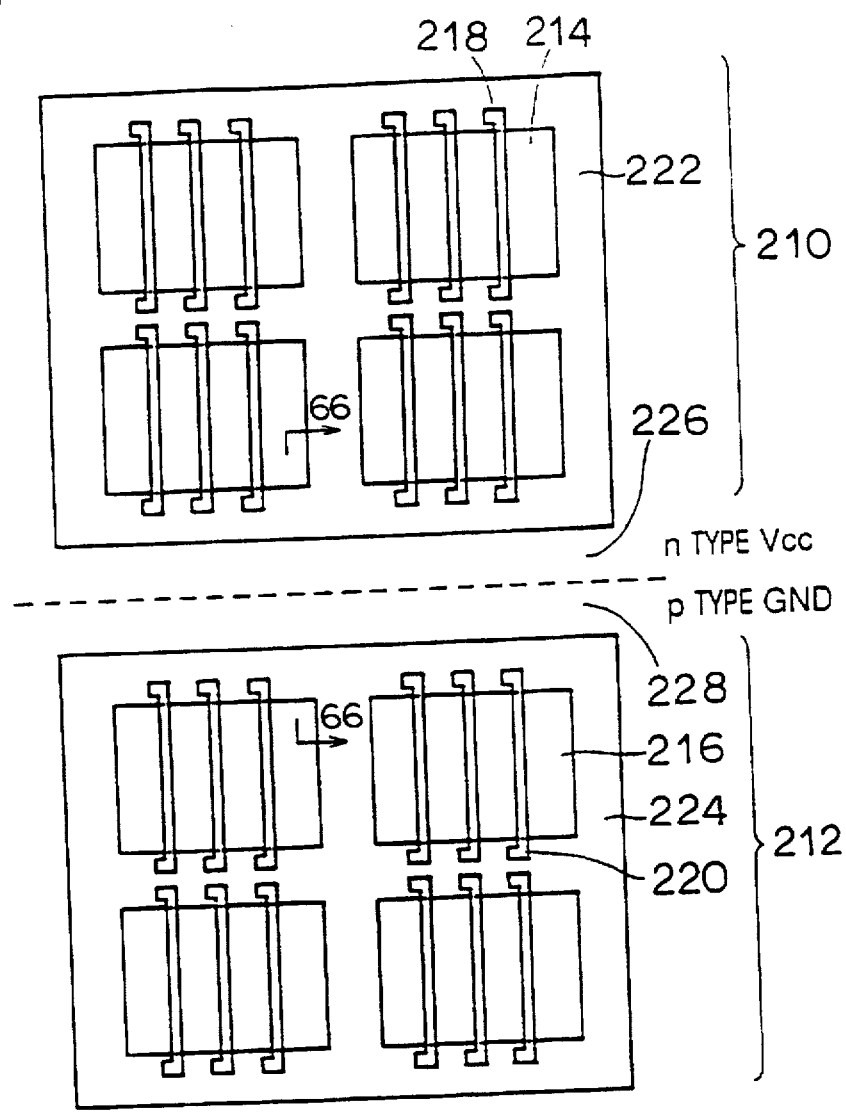
FIG. 65 is a plan of a semiconductor device according to a sixteenth embodiment of the present invention.
Figure 66:
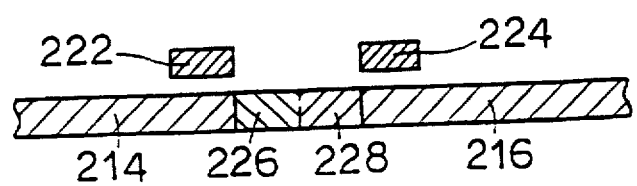
FIG. 66 is a sectional view taken along the line D—D of FIG. 65.

Description will now be given of the sixteenth embodiment of the present invention with reference to FIGS. 65 and 66. In this embodiment, description will be given of a structure in which a pMOS field effect transistor forming region 210 and an nMOS field effect transistor forming region 212 are disposed alternately.

Referring to these figures, an active region 214 of the pMOS field effect transistor is formed in pMOS field effect transistor forming region 210. Gate electrodes of the pMOS field effect transistor are disposed at a prescribed position in active region 214 of the pMOS field effect transistor. A field shield gate electrode 222 is disposed on gate electrodes 218.

An active region 216 of the nMOS field effect transistor is provided in nMOS field effect transistor forming region 212. Gate electrodes 220 of the nMOS field effect transistor are disposed at a prescribed position on the active region of the nMOS field effect transistor. A field shield gate electrode 224 is disposed on gate electrodes 220.

At an interface portion between pMOS field effect transistor forming region 210 and nMOS field effect transistor forming region 212, formed are an n type body contact region 226 and a p type body contact region 228. n type body contact region 226 is fixed to the supply potential ($V_{cc}$) or higher. p type body contact region 228 is fixed to the supply potential or less.

By providing n type body contact region 226 and p type body contact region 228 as described above, excessive carriers generated by impact ionization can be attracted. The increase in the channel potential can be prevented, resulting in improvement in the breakdown voltage between source and drain.

Figure 67:
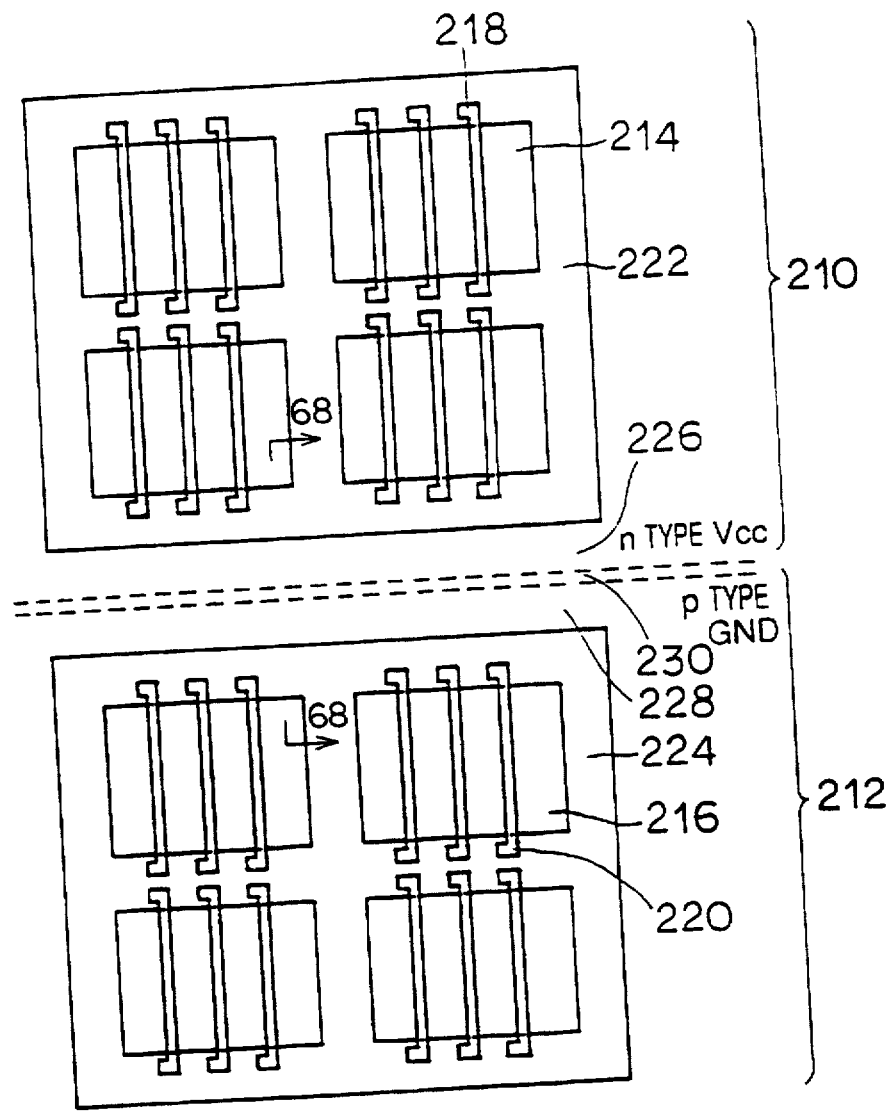
FIG. 67 is a plan view of a semiconductor device according to a seventeenth embodiment of the present invention.
Figure 68:
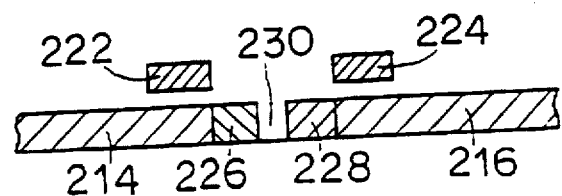
FIG. 68 is a sectional view taken along the line E—E of FIG. 67.

Description will now be given of the seventeenth embodiment of the present invention with reference to FIGS. 67 and 68. In the sixteenth embodiment described above, a high voltage is applied to the interface between n type body contact region 226 and p type body contact region 228. Therefore, the breakdown voltage is decreased. In order to prevent the decrease in the breakdown voltage, in this embodiment, a groove 230 of the minimum isolation width is provided at the interface between n type body contact region 226 and p type body contact region 228. By providing groove 230 as described above, n type body contact region 226 and p type body contact region 228 are electrically isolated. Therefore, a high voltage is not applied, not causing decrease of the breakdown voltage.

Figure 69:
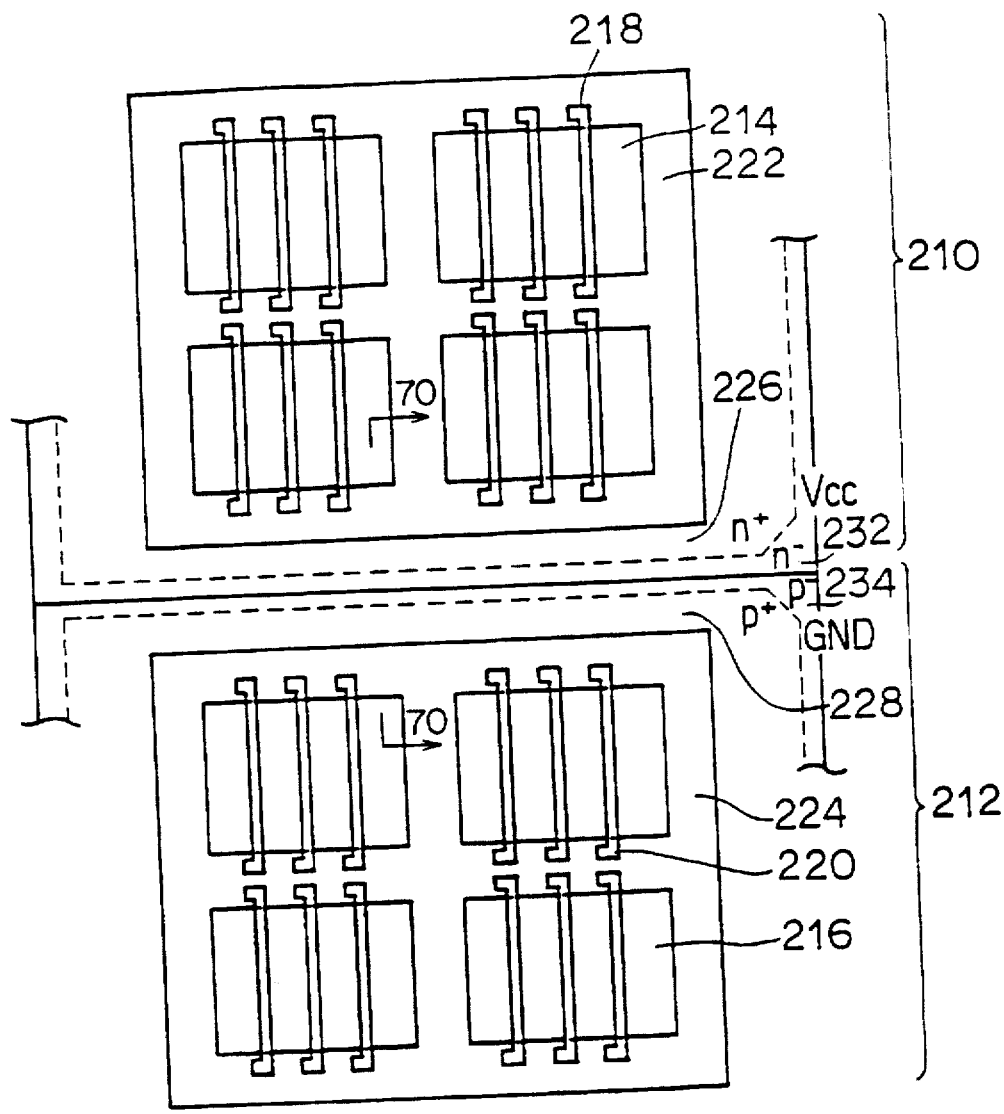
FIG. 69 is a plan view of a semiconductor device according to the eighteenth embodiment of the present invention.
Figure 70:
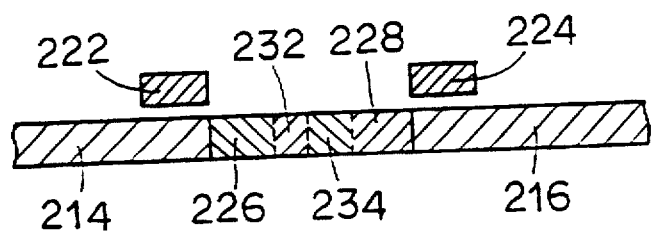
FIG. 70 is a sectional view taken along the line F—F of FIG. 69.

Description will now be given of the eighteenth embodiment of the present invention with reference to FIGS. 69 and 70. As one structure for solving the problem of the above-described sixteenth embodiment, groove 230 is formed between n type body contact region 226 and p type body contact region 228 in the seventeenth embodiment. However, in this embodiment, an n⁻ isolation region 232 and a p⁻ isolation region 234 each having an impurity concentration of approximately $1 \times 10^{16}$ cm$^{-3}$ are further provided at the interface between n type body contact region 226 and p type body contact region 228. By providing such impurity regions of a low concentration, the electric field can be reduced. Therefore, decrease of the breakdown voltage can be prevented.

Figure 71:
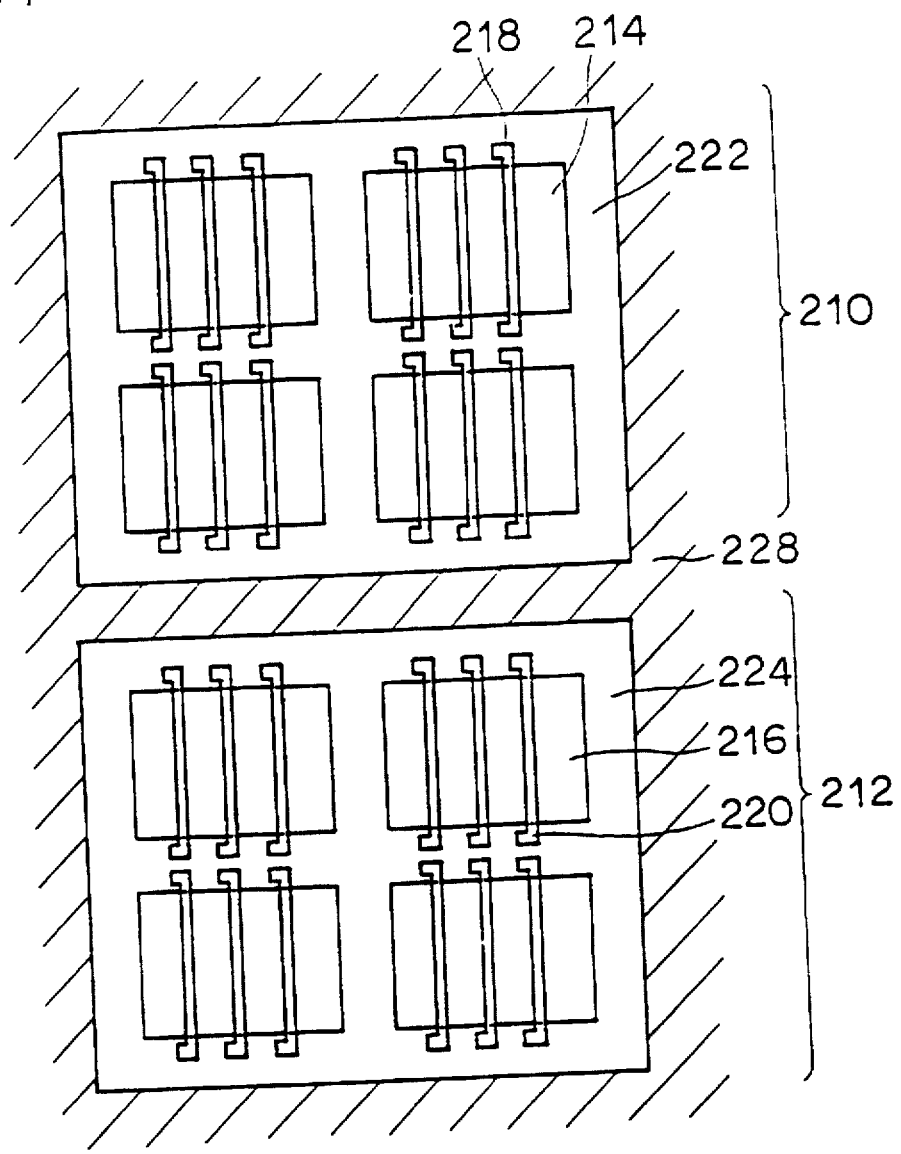
FIG. 71 is a plan view of a semiconductor device according to a nineteenth embodiment of the present invention.

Description will now be given of the nineteenth embodiment of the present invention with reference to FIG. 71. In the eighteenth embodiment described above, n⁻ isolation region 232 and p⁻ isolation region 234 are further provided at the interface between n type body contact region 226 and p type body contact region 228. However, there is a case where holes are generated by impact ionization in the channel in the transistor forming region. In order to prevent generation of holes, it is possible to cover the surroundings of field shield gate electrodes 222, 224 with p type impurities to fix field shield gate electrodes 222, 224 to the ground potential, as shown in FIG. 71.

Figure 73:
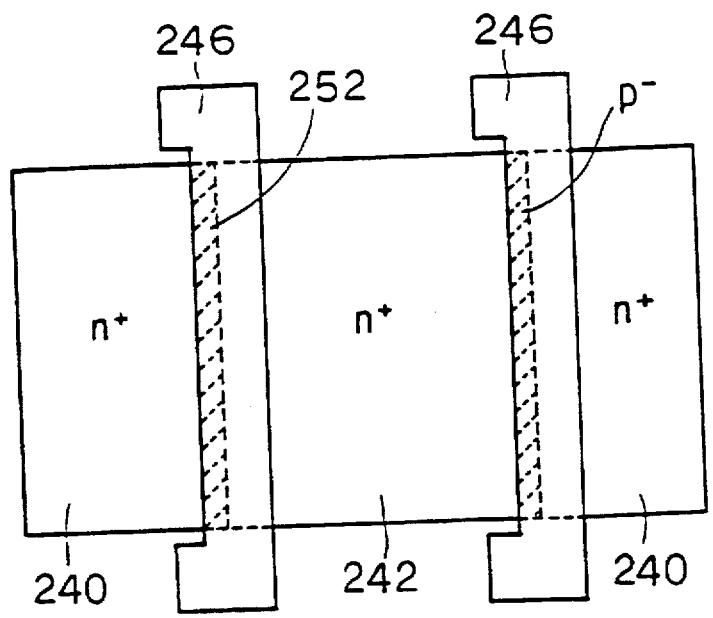
FIG. 73 is a first plan view of the semiconductor device according to the twentieth embodiment of the present invention.
Figure 74:
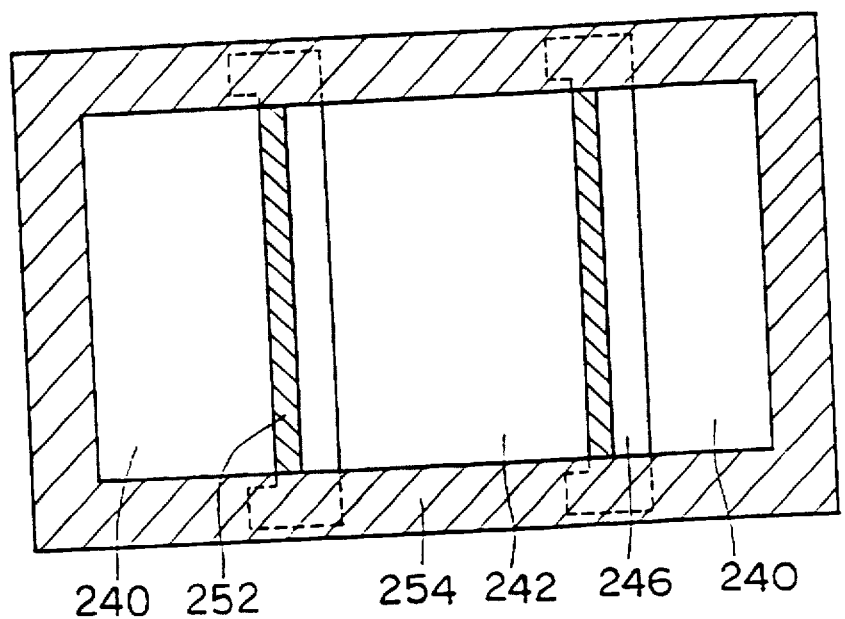
FIG. 74 is a second plan view of the semiconductor device according to the twentieth embodiment of the present invention.
Figure 75:
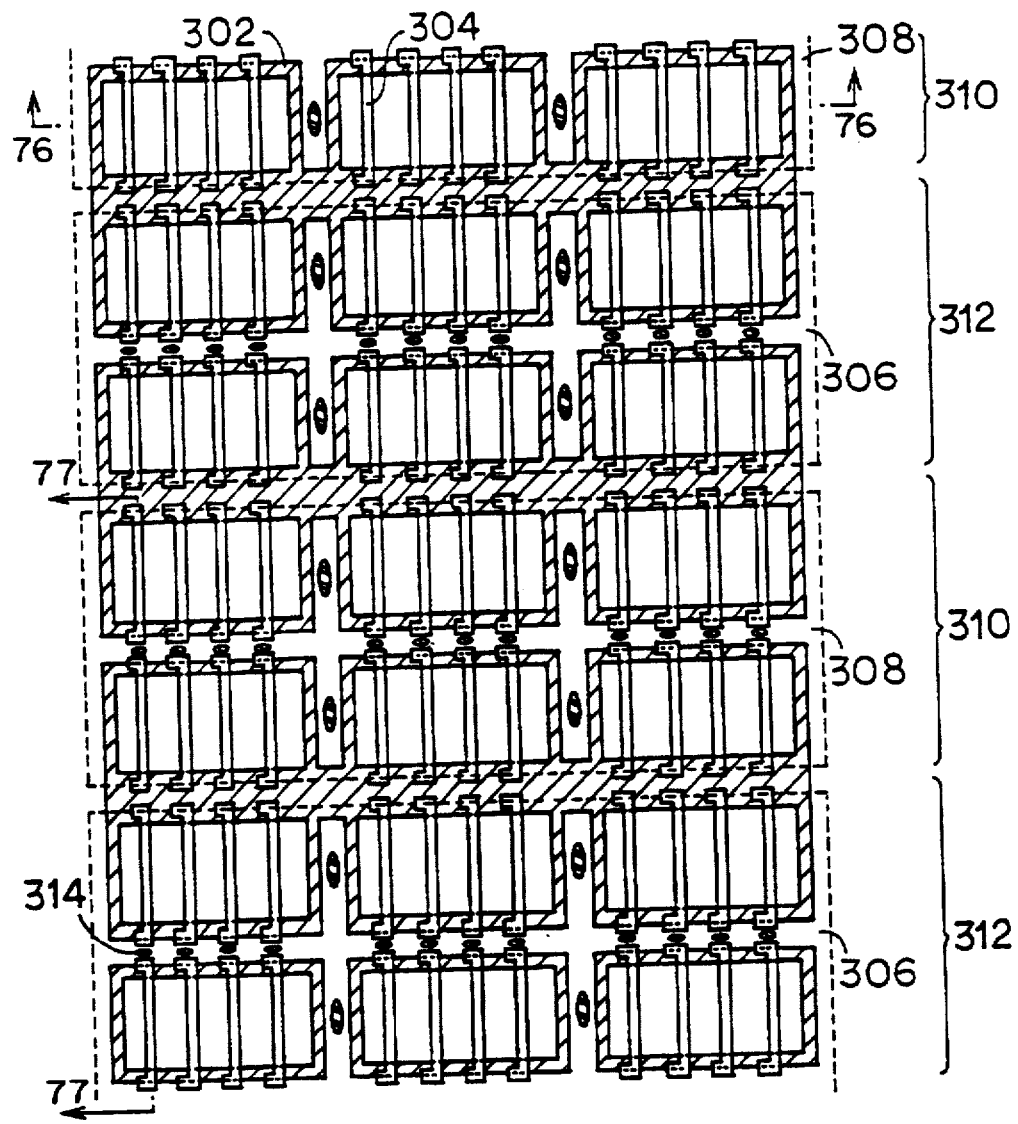
FIG. 75 is a plan view of a conventional semiconductor device.
Figure 76:
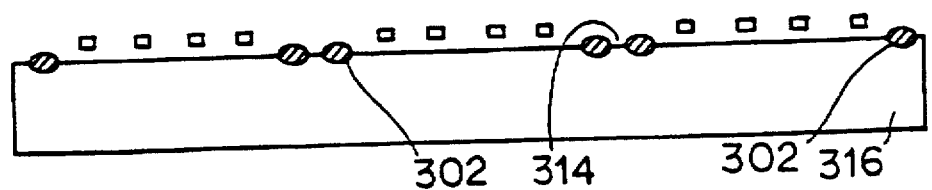
FIG. 76 is a sectional view taken along the line A—A of FIG. 75.
Figure 77:
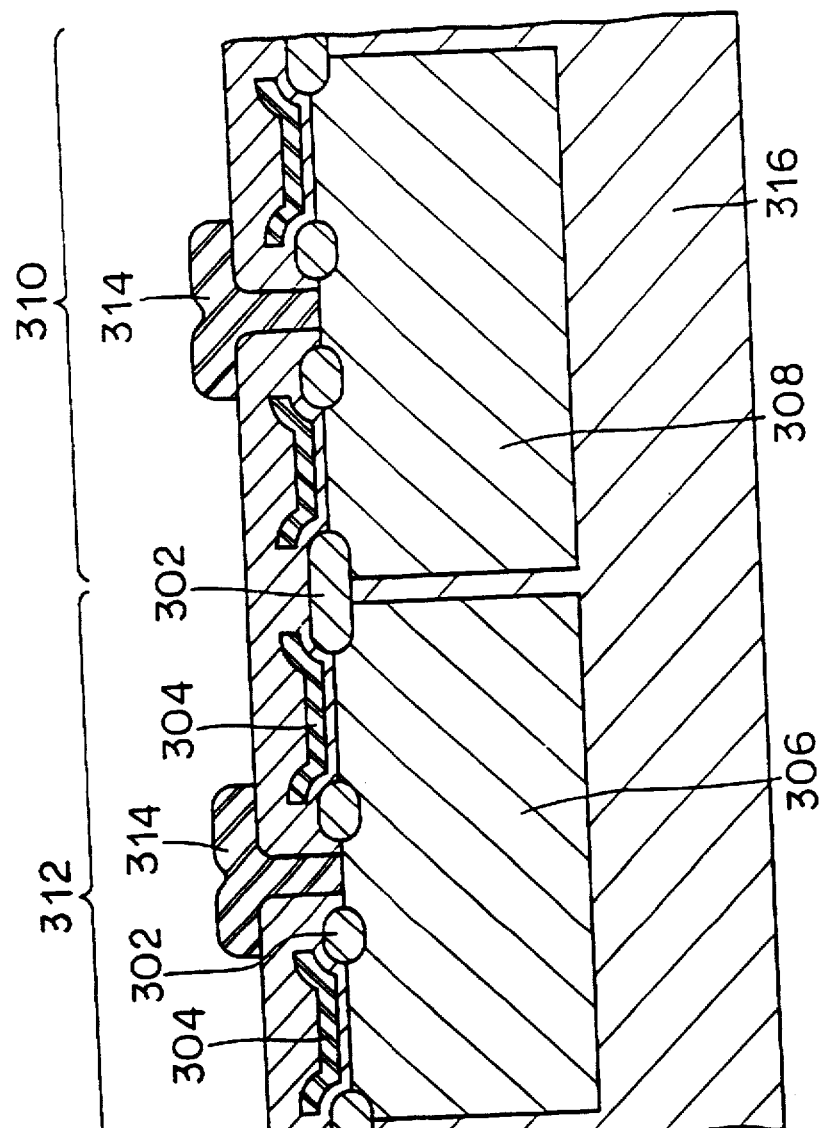
FIG. 77 is a sectional view taken along the line X—X of FIG. 75.
Figure 78:
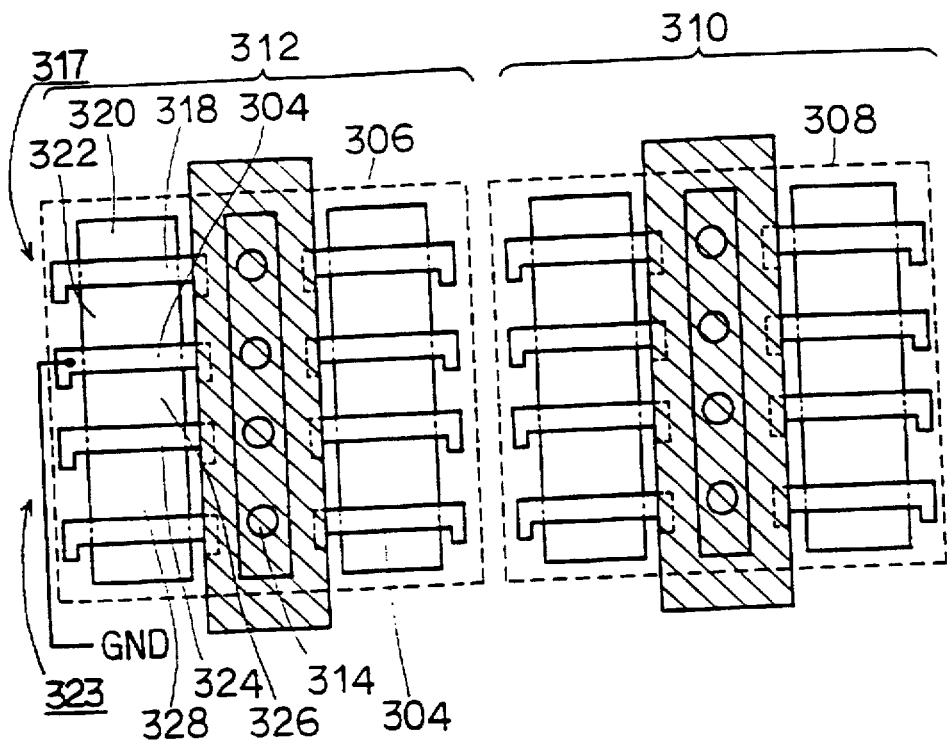
FIG. 78 is a partially enlarged diagram showing a plan structure of the conventional semiconductor device.
Figure 79A:
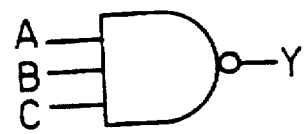
FIG. 79A is a block diagram of a 3-input NAND gate.
Figure 79B:
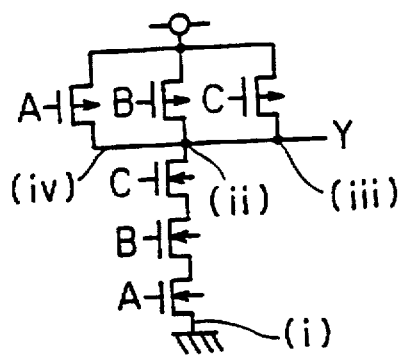
FIG. 79B is a circuit diagram of the 3-input NAND gate.
Figure 80:
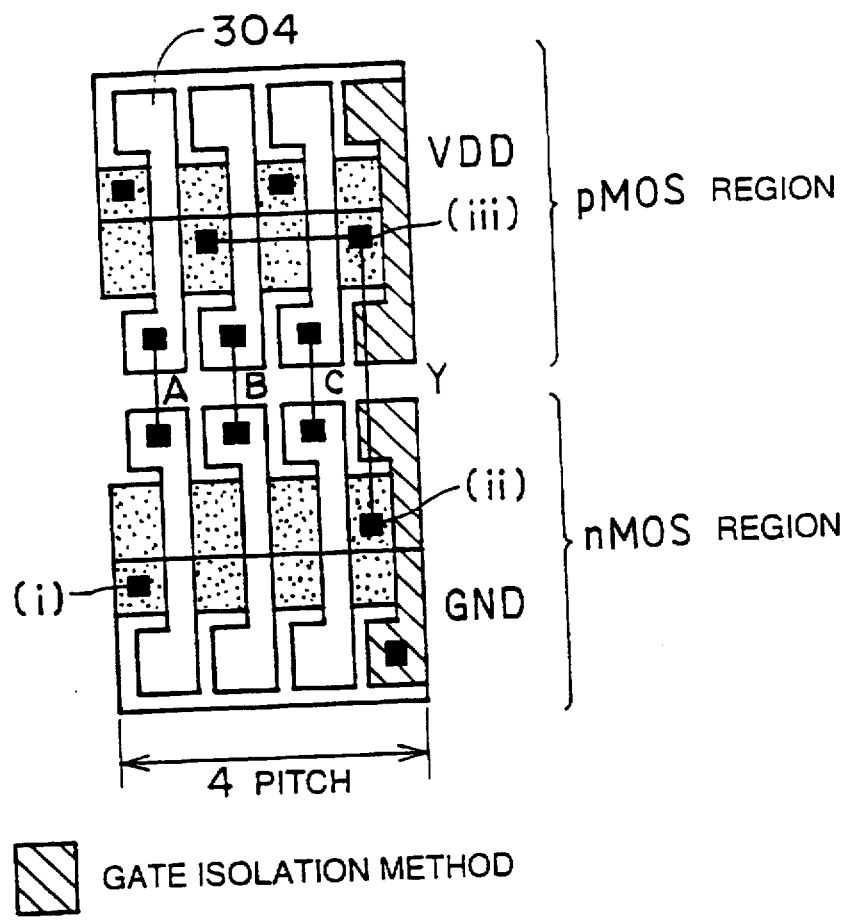
FIG. 80 is a plan view of a semiconductor device implementing the 3-input NAND gate.
Figure 81:
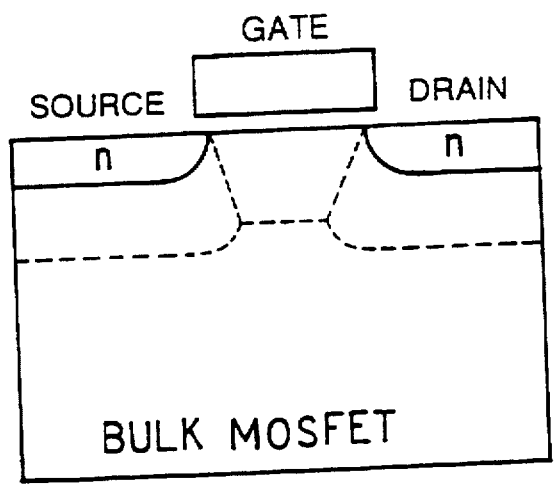
FIG. 81 is a schematic diagram showing a spread of a depletion layer of a bulk field effect transistor.
Figure 82:
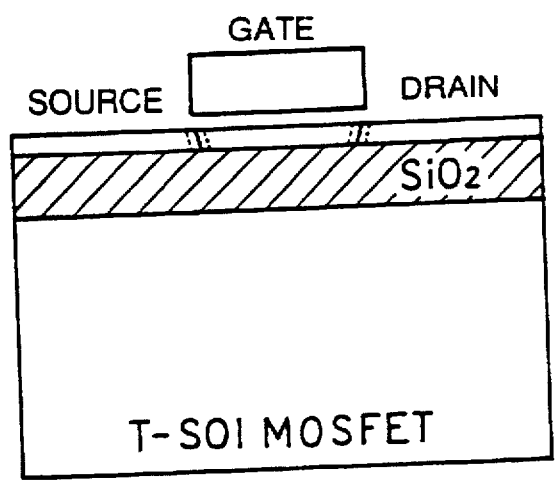
FIG. 82 is a schematic diagram showing a spread of a depletion layer of an SOI field effect transistor.
Figure 83:
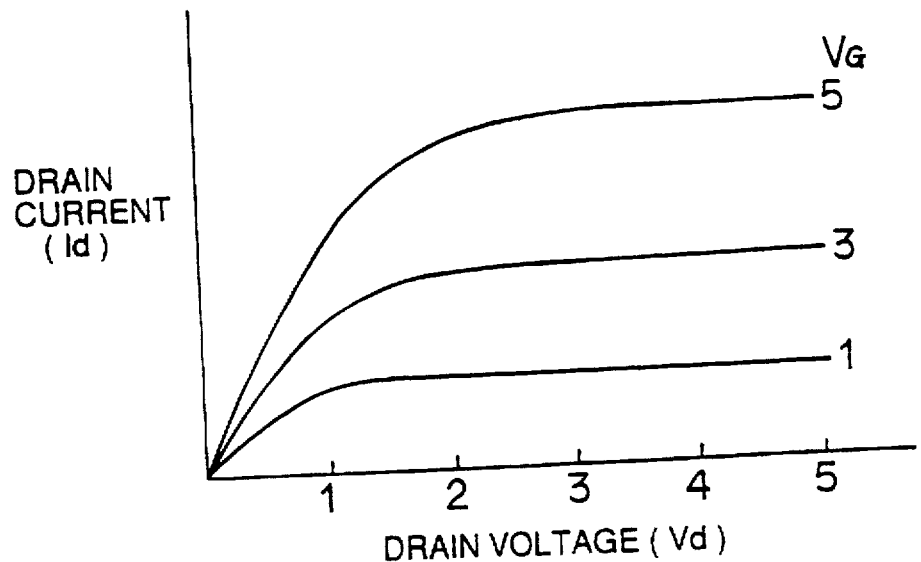
FIG. 83 is a graph showing the relationship between drain current and drain voltage of the MOS field effect transistor shown in FIG. 81.
Figure 84:
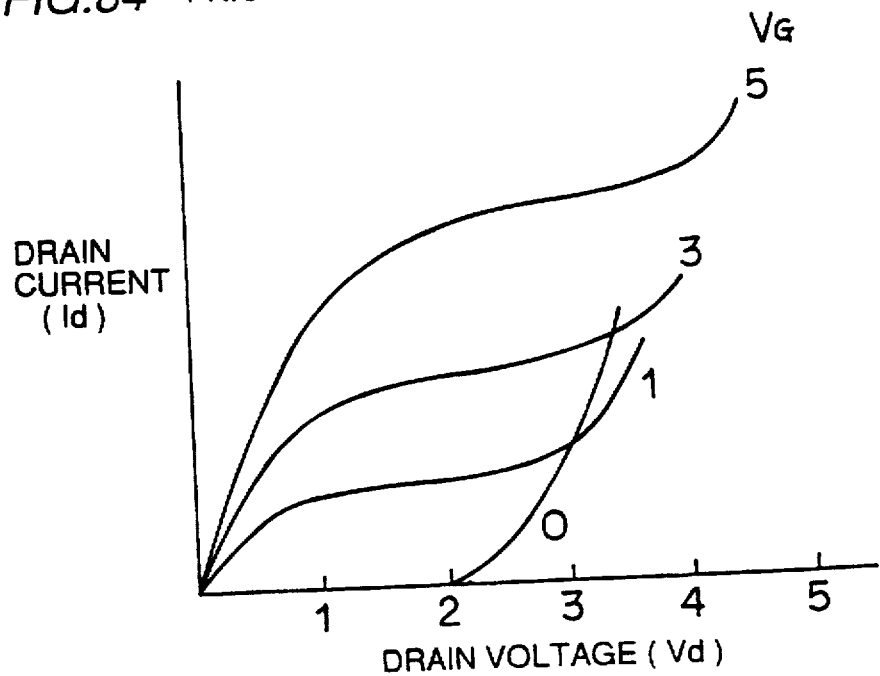
FIG. 84 is a graph showing the relationship between drain current and drain voltage of the MOS field effect transistor shown in FIG. 82.
Figure 87:
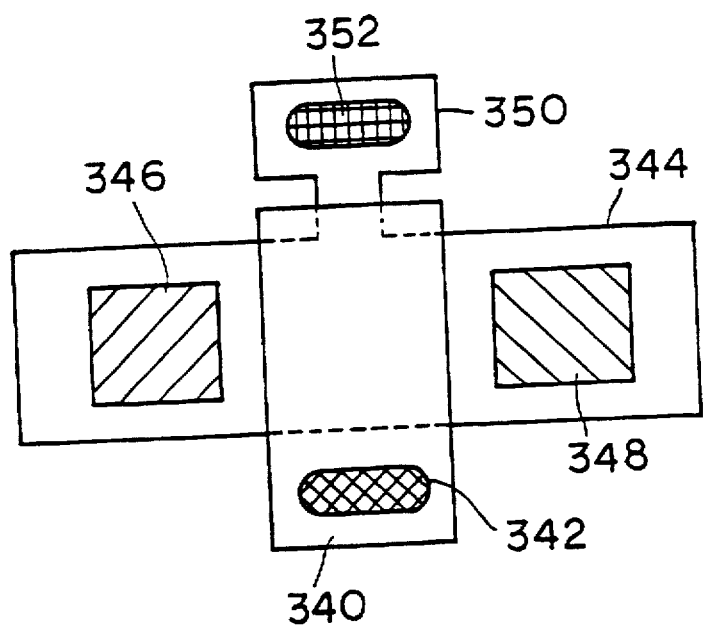
FIG. 87 is a plan view of a semiconductor device for eliminating the substrate floating effect in the conventional art.

Description will now be given of the twentieth embodiment of the present invention with reference to FIGS. 72 to 74. As described with respect to the nineteenth embodiment, holes are generated by impact ionization in the channel. Therefore, only the breakdown voltage between source and drain of the nMOS field effect transistor has to be taken into consideration. In order to improve the breakdown voltage between source and drain of the nMOS field effect transistor, a region of an impurity concentration higher than that of the p type channel portion is formed in the channel portion in the vicinity of the source region, thereby preventing implantation of electrons from the source region.

Figure 72:
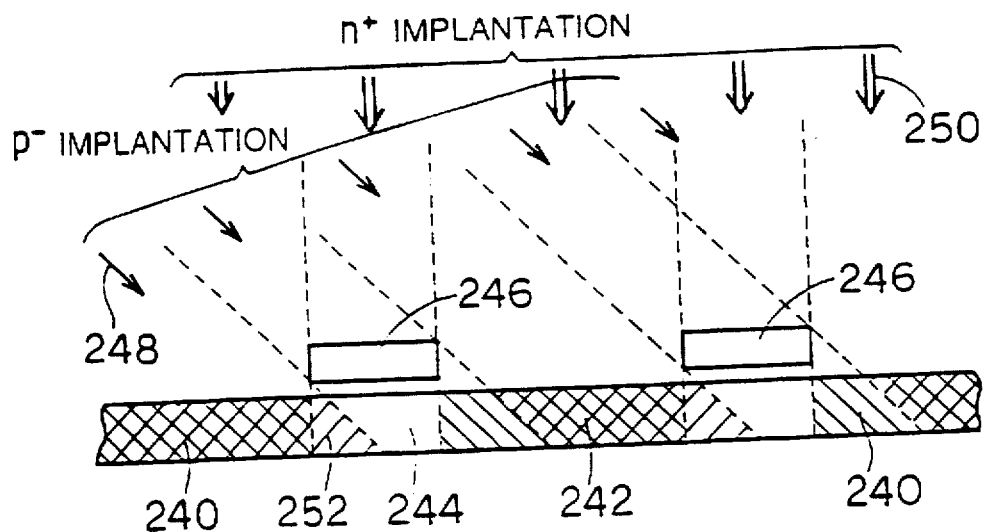
FIG. 72 is a sectional view of a semiconductor device according to a twentieth embodiment of the present invention.

Referring to FIG. 72, source region 240 and drain region 242 are formed on both sides of gate electrode 246. A region 252 of a p type impurity concentration higher than that of channel region 244 in the vicinity of source region 240 is formed on one side of channel region 244 under gate electrode 246. Referring to FIG. 74, a field shield isolation region 254 is formed in the surroundings of gate electrode 246.

Referring again to FIG. 72, description will now be given of a method of manufacturing the nMOS field effect transistor shown in FIG. 72. After field isolation of the SOI layer, p type impurities such as boron are implanted into the entire surface of the SOI layer in an implantation amount of approximately $1 \times 10^{12}$ cm$^{-2}$, to form a gate electrode. Boron in an amount of approximately $1 \times 10^{13}$ cm$^{-2}$ is additionally implanted in one direction. By forming an ordinary source/drain region, the transistor is completed. As shown in FIGS. 72 and 73, channel region 252 higher in an impurity concentration than channel region 244 is formed in channel region 244 in the vicinity of source region 240.

By forming such an impurity profile, holes generated by impact ionization in channel region 244 in the vicinity of drain region 242 flow to source region 240. Since channel region 252 of a high concentration is provided, a potential barrier with respect to source region 240 is high. As a result, holes are less likely to enter source region 240, suppressing implantation of electrons from source region 240.

In the semiconductor device according to the present invention, in one aspect, a field oxide film is formed so as to cover the main surface of a semiconductor layer and to reach the main surface of an insulating layer. As a result, a first transistor forming region and a second transistor forming region can be electrically isolated from each other completely. Therefore, latchup can be prevented completely.

The semiconductor device according to the present invention has, in another aspect, a mesa isolation region for isolating a first transistor forming region and a second transistor forming region. As a result, the first transistor forming region and the second transistor forming region can be electrically isolated from each other completely. Therefore, latchup can be prevented completely.

In the semiconductor device according to the present invention, in a still another aspect, respective semiconductor layers of first and second transistor forming regions can be fixed at different prescribed potentials. As a result, decrease of the breakdown voltage between source and drain caused by the substrate floating effect can be prevented.

The semiconductor device according to the present invention has, in a further aspect, a third field shield gate electrode at an end surface portion of a semiconductor layer in a mesa isolation region.

As a result, a voltage applied to a gate electrode is applied to both end portions of the semiconductor layer. As a result, the potential at the end surface portion of the semiconductor layer is suppressed. Therefore, the electric field concentration is prevented, and leakage current is further prevented. It is possible to suppress decrease in the threshold voltage at the sidewall or the corner portion of the semiconductor layer.

In the semiconductor device according to the present invention, in a further aspect, a first electrode is electrically insulated from a first shield gate electrode, and a second electrode is electrically insulated from a second field shield gate electrode. As a result, the first and second electrodes can be set at a potential different from that of a semiconductor layer.

In the semiconductor device according to the present invention, in a further aspect, a first electrode is electrically connected to a first field shield gate electrode, and a second electrode is electrically connected to a second field shield gate electrode. As a result, the first and second electrodes can be set at the same potential as that of a semiconductor layer.

In the semiconductor device according to the present invention, in a further aspect, an MOS transistor is separated into two regions with a gate electrode in an unused region. As a result, it is not necessary to form an isolation region, implementing high integration of the semiconductor device.

In the semiconductor device according to the present invention, in a further aspect, a recessed portion is provided in a first transistor forming region positioned at an end of a first field shield gate electrode, and a recessed portion is provided in a second transistor forming region positioned at an end of a second field shield gate electrode. First and second field shield gate electrodes can be formed in first and second MOS field effect transistor forming regions. As a result, MOS field effect transistor forming regions can be disposed in parallel with the minimum isolation width. Therefore, high integration of the semiconductor device can be implemented.

In the semiconductor device according to the present invention, in a further aspect, a first impurity region of a second conductivity type and a first impurity region of a first conductivity type are provided. Excessive carriers generated by impact ionization can be attracted by using the impurity regions, thereby preventing increase of the channel potential. As a result, the breakdown voltage between source and drain can be enhanced.

In the semiconductor device according to the present invention, in a further aspect, a groove is provided at the interface between a first impurity region of a second conductivity type and a first impurity region of a first conductivity type. Since it is possible to electrically isolate the first impurity region of the second conductivity type and the first impurity region of the first conductivity type, a high electric field applied between the first impurity region of the second conductivity type and the first impurity region of the first conductivity type can be reduced, thereby preventing decrease of the breakdown voltage of the semiconductor device.

In the semiconductor device according to the present invention, in a further aspect, a second impurity region of a second conductivity type lower in an impurity concentration than a first impurity region of the second conductivity type, and a second impurity region of a first conductivity type lower in an impurity concentration than a first impurity region of the first conductivity type are provided between the first impurity region of the second conductivity type and the first impurity region of the first conductivity type. As a result, a high electric field between the first impurity region of the second conductivity type and the first impurity region of the first conductivity type is reduced, making it possible to prevent decrease of the breakdown voltage of the semiconductor device.

In the semiconductor device according to the present invention, in a further aspect, an impurity region of a first conductivity type is provided in a semiconductor layer between a first field shield gate electrode and a second field shield gate electrode, for holding the semiconductor layer at a prescribed potential. As a result, holes generated by impact ionization in a channel can be attracted, thereby preventing increase in the potential of the channel region.

In the semiconductor device, according to the present invention, in a further aspect, in the vicinity of a source region, formed is a high concentration impurity region higher in an impurity concentration than that of the source region. As a result, holes generated by impact ionization in a channel region in the vicinity of a drain region flow in the vicinity of the source region. At this time, since the high concentration impurity region is provided, a potential barrier with respect to the source region is high. As a result, holes are less likely to enter the source region, thereby suppressing implantation of electrons from the source region.

According to a method of manufacturing a semiconductor device of the present invention, a third field oxide film, covering the main surface of a semiconductor layer and reaching the main surface of an insulating layer, for isolating a first transistor forming region and a second transistor forming region, first field oxide films in the first transistor forming region, and second field oxide films in the second transistor forming region can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming an oxide film on a semiconductor layer on the substrate with an insulation film therebetween and forming at a prescribed position a first field oxide film in plural reaching said insulating film with an LOCOS method; and forming a second field oxide film smaller in thickness than said first field oxide film again with an LOCOS method in a region sandwiched by said first field oxide films.

2. A method of manufacturing a semiconductor device comprising the steps of:

forming an oxide film on a semiconductor layer on the substrate with an insulation film therebetween and forming a first field oxide film having a first width and a second field oxide film having a second width smaller than said first width with an LOCOS method; and oxidizing only said first field oxide film and growing said first field oxide film in thickness until said first field oxide film reaches said insulating film again with an LOCOS method.

3. A method of manufacturing a semiconductor device comprising the steps of:

forming an oxide film on a semiconductor layer on the substrate with an insulation film therebetween;

forming a nitride film on said oxide film;

forming on said nitride film a resist film having a prescribed pattern, and etching said semiconductor layer to a prescribed depth with said resist film used as a mask to form a recessed portion of a prescribed depth in said semiconductor layer;

removing said resist film, and then forming again a resist film having a prescribed pattern to pattern the nitride film positioned between said recessed portion and said recessed portion with the resist film used as a mask; and removing said resist film, and then forming a first field oxide film obtained by growth of an oxide film in said recessed portion reaching the insulating film and a second field oxide film between said recessed portion and said recessed portion with an LOCOS method.

4. A method of manufacturing a semiconductor device comprising the steps of:

forming an oxide film on a semiconductor layer on the substrate with an insulating film therebetween;

forming a buffer layer on said oxide film;

forming a nitride film on said buffer layer;

forming on said nitride film a first resist film having a first opening portion and a second opening portion wider than said first opening portion and etching said nitride film until a surface of said buffer layer is exposed with said first resist film used as a mask;

forming a second resist film so as to fill only said first opening portion and etching said buffer layer with said first resist film and said second resist film used as a mask; and removing said first and second resist films, and then forming a first field oxide film reaching said insulating film at a position of said first opening portion and a second field oxide film at a position of said second opening portion with said nitride film used as a mask with an LOCOS method.

* * * * *